(12) United States Patent  (10) Patent No.: US 7,830,009 B2
Awano et al.  (45) Date of Patent: Nov. 9, 2010

(54) SEMICONDUCTOR PACKAGE AND METHOD OF MANUFACTURING THE SAME

(75) Inventors: Yuji Awano, Kawasaki (JP); Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 364 days.

(21) Appl. No.: 11/898,750

(22) Filed: Sep. 14, 2007

(65) Prior Publication Data

US 2008/0169563 A1    Jul. 17, 2008

Related U.S. Application Data

(63) Continuation of application No. PCT/JP2005/004765, filed on Mar. 17, 2005.

(51) Int. Cl.
H01L 23/48    (2006.01)
(52) U.S. Cl. ........................ 257/746; 257/720; 257/741; 257/772; 257/778
(58) Field of Classification Search ........................ None
See application file for complete search history.

(56) References Cited

U.S. PATENT DOCUMENTS 6,297,063 B1 *  10/2001  Brown et al. .................... 438/2

FOREIGN PATENT DOCUMENTS

| JP | 2001-177052 | 6/2001 |
| JP | 2002-141633 | 5/2002 |
| JP | 2002-329723 | 11/2002 |
| JP | 2003-109689 | 4/2003 |
| JP | 2004-75422 | 3/2004 |

OTHER PUBLICATIONS

M. Nihei, et al.; "Simultaneous formation of multi-wall carbon nanotubes and their low-resistance ohmic contacts for future ULSI via internconnects;" *Extended Abstracts of the 2003 International Conference on Solid State Devices and Materials*; 2003; pp. 798-799.

* cited by examiner

*Primary Examiner*—N Drew Richards
*Assistant Examiner*—Kyoung Lee
(74) *Attorney, Agent, or Firm*—Kratz, Quintos & Hanson, LLP

(57) ABSTRACT

A semiconductor package is disclosed that includes a semiconductor device; a circuit board; and a connection mechanism including a first conductive terminal provided on the semiconductor device, and a second conductive terminal provided on the circuit board side, the connection mechanism electrically connecting the semiconductor device and the circuit board via the first conductive terminal and the second conductive terminal. At least one of the first conductive terminal and the second conductive terminal of the connection mechanism includes one or more carbon nanotubes each having one end thereof fixed to the surface of the at least one of the first conductive terminal and the second conductive terminal, and extending in a direction away from the surface. The first conductive terminal and the second conductive terminal engage each other through the carbon nanotubes.

17 Claims, 19 Drawing Sheets

(a)   (b)

SEMICONDUCTOR PACKAGE AND METHOD OF MANUFACTURING THE SAME

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2005/004765, filed on Mar. 17, 2005, the entire contents of which are hereby incorporated by reference.

BACKGROUND OF THE INVENTION

1. Field of the Invention

The present invention relates generally to semiconductor packages having an electrical connection mechanism having carbon nanotubes and methods of manufacturing the same. The present invention relates more particularly to a semiconductor package having a connection mechanism that establishes an electrical connection through the contact of carbon nanotubes with a conductor or the contact of carbon nanotubes with each other and allows repeated detachment and (re-)attachment without damage, and to a method of manufacturing the same.

2. Description of the Related Art

The carbon nanotube is a fine conductor having a two-dimensional shape. It has been proposed to use a carbon nanotube for a vertical interconnect between circuit layers, taking advantage of its characteristic of high current density. (See, for example, Patent Document 1 and Patent Document 2.)

Further, since the carbon nanotube is formed of firmly bound carbon atoms, the carbon nanotube has the merit of extremely high mechanical strength. For example, it has been reported that the carbon nanotube sustains 1500 tons per cross-sectional area of 1 cm$^2$. This means that the carbon nanotube can sustain 10 or more times as much force with the same cross-sectional area and a hundred or more times as much force with the same weight as steel wire.

On the other hand, the carbon nanotube has not only high mechanical strength but also flexibility and moderate elasticity. Accordingly, the carbon nanotube can also be bent flexibly without causing damage to its structure. Further, the carbon nanotube is a new material having merits such as high thermal conductivity.

It is known that the carbon nanotube can be formed by various methods. For example, it has been reported that it is possible to cause a carbon nanotube to be oriented and grow in a substantially perpendicular direction from a catalyst metal pattern selectively positioned and formed by CVD (Nihei, M.; *Extended Abstracts of the* 2003 *International Conference on Solid state Devices and Materials,* 798-799 (2003)).

In these years, multifunctional and small-size semiconductor devices have been developed at a rapid pace in response to demands for high-speed communications and large-capacity communications. At present, semiconductor packages have pin pitches less than or equal to approximately 50 μm. It is expected that the number of pins will increase so as to further reduce the pin pitch in the future as semiconductor packages become more multifunctional and smaller in size. It is known that as the pin pitch becomes smaller, a pin should be finer (thinner) because of dimensional restrictions so as to be reduced in its mechanical strength. Further, such an extra-fine pin has a disadvantage in that it can only be removed by cutting once connected by solder bonding.

Further, methods of vertically stacking and connecting multiple semiconductor chips have drawn attention as next-generation techniques of connecting semiconductor chips. These methods have the merit of being able to reduce an interconnection distance by vertically stacking and electrically connecting multiple semiconductor chips and accordingly to increase operating speed.

However, according to these methods, when one of the multiple chips fails, it is necessary to remove all the chips. Accordingly, these methods have a disadvantage in that not only the failed chip but also the other normal chips have to be destroyed at the time of their removal.

[Patent Document 1] Japanese Laid-Open Patent Application No. 2002-141633

[Patent Document 2] Japanese Laid-Open Patent Application No. 2002-329723

SUMMARY OF THE INVENTION

Embodiments of the present invention may solve or reduce one or more of the above-described problems.

According to one aspect of the present invention, there are provided a semiconductor package in which one or more of the above-described problems may be solved or reduced, and a method of manufacturing the same.

According to one aspect of the present invention, there are provided a semiconductor package having an electrical connection mechanism in which one or more of the above-described problems may be solved or reduced, and a method of manufacturing the same.

According to one aspect of the present invention, there are provided a semiconductor package having an electrical connection mechanism that allows repeated attachment and detachment, and a method of manufacturing the same.

According to one aspect of the present invention, there is provided a semiconductor package including a semiconductor device; a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, wherein at least one of the first conductive terminal and the second conductive terminal of the connection mechanism includes one or more carbon nanotubes each having one end thereof fixed to a surface of the at least one of the first conductive terminal and the second conductive terminal, and extending in a direction away from the surface, and the first conductive terminal and the second conductive terminal engage each other through the carbon nanotubes.

According to the above-described semiconductor package, since carbon nanotubes have flexibility and elasticity, it is possible to repeatedly insert and extract the first conductive terminal or the second conductive terminal, so that the semiconductor device and the circuit board can be repeatedly attached to and detached from each other. As a result, it is possible to reduce the manufacturing cost of the semiconductor package by replacing only the semiconductor device or the circuit board if the semiconductor device or the circuit board is defective or fails. In particular, even if the semiconductor package contains a defective product (part or component), only the defective product may be replaced, and unlike in the conventional case, there is no need to discard good products (parts or components). Accordingly, it is possible to reduce consumption of resources. Further, since carbon nanotubes have extremely high mechanical strength, the connection mechanism can support the semiconductor device and firmly join the semiconductor device and the circuit board mechanically.

According to one aspect of the present invention, there is provided a semiconductor package including a semiconductor device; a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, wherein the connection mechanism further includes a first bundle of carbon nanotubes having a first end thereof fixed to a surface of the first conductive terminal, and extending in a direction away from the surface; a second bundle of carbon nanotubes having a first end thereof fixed to a surface of the second conductive terminal, and extending in a direction away from the surface; and a low-melting metal layer fixing a second end part of the first bundle of the carbon nanotubes and a second end part of the second bundle of the carbon nanotubes to each other with the second end of the first bundle of the carbon nanotubes and the second end of the second bundle of the carbon nanotubes opposing each other across the low-melting metal layer.

According to one aspect of the present invention, there is provided a method of manufacturing a semiconductor package, the semiconductor package including a semiconductor device; a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, the method including the steps of forming a catalyst layer on at least one of the first conductive terminal and the second conductive terminal, the catalyst layer covering a surface of the at least one of the first conductive terminal and the second conductive terminal; and forming a carbon nanotube using the catalyst layer as a starting point of growth of the carbon nanotube.

According to the above-described method, it is possible to cause carbon nanotubes to grow on the surfaces of the first conductive terminal and the second conductive terminal, and it is possible to realize a connection mechanism that allows attachment and detachment of the semiconductor device and the circuit board.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of embodiments of the present invention.

First Embodiment

Figure 1:
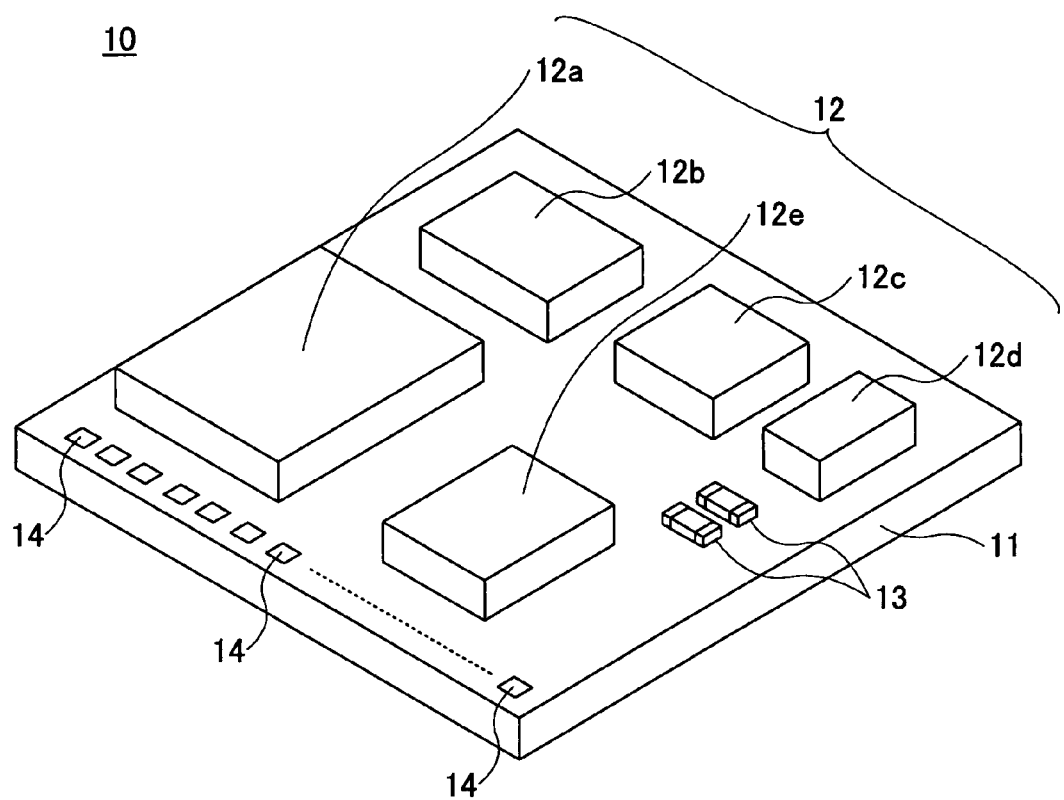
FIG. 1 is a perspective view of a semiconductor package according to a first embodiment of the present invention.

FIG. 1 is a perspective view of a semiconductor package 10 according to a first embodiment of the present invention.

Referring to FIG. 1, the semiconductor package 10 according to the first embodiment includes a circuit board 11, semiconductor devices such as an MPU (microprocessor unit) 12a, a DRAM 12b, a ROM 12c, an input/output interface IC 12d, an analog IC 12e mounted on the circuit board 11, passive elements 13 such as a resistive element and a capacitor, and external electrodes 14. Hereinafter, the MPU 12a, the DRAM 12b, the ROM 12c, the input/output interface IC 12d, and the analog IC 12e may be collectively or individually referred to as "semiconductor device 12" for convenience of description. Further, interconnects (interconnection lines) (not graphically illustrated) that electrically connect the semiconductor device 12 and the passive elements 13 are provided on the circuit board 11. The semiconductor device 12 may be, for example, a semiconductor chip or a semiconductor chip mounted on a multilayer interconnection board or an interposer (a so-called chip-size package).

The semiconductor device 12 is electrically connected to the circuit board 11 with a connection mechanism provided at the bottom of the semiconductor device 12. (The connection mechanism is not graphically illustrated because it is hidden by the semiconductor device 12.)

The semiconductor package 10 shown in FIG. 1 is one example of this embodiment, and the number and types of semiconductor devices 12 and the configurations of the passive elements 13 are not limited in particular.

Figure 2:
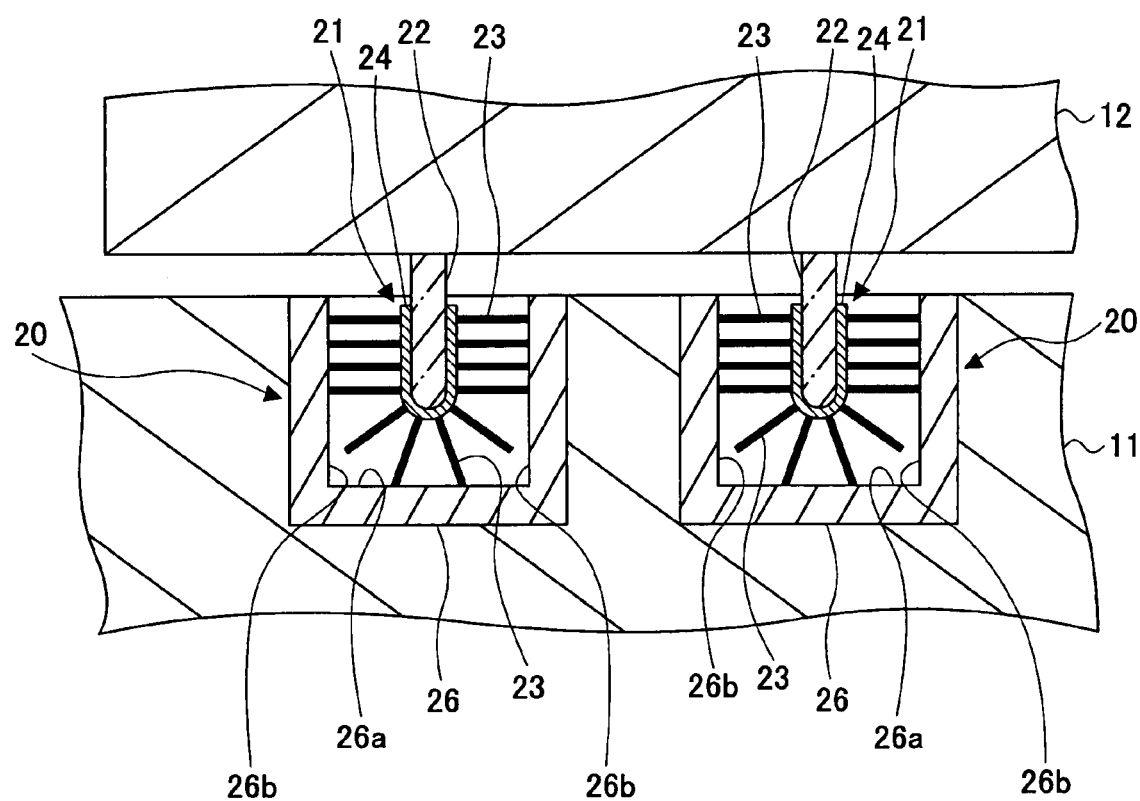
FIG. 2 is a cross-sectional view of a first example of a connection mechanism according to the first embodiment of the present invention.

FIG. 2 is a cross-sectional view of a first example of the connection mechanism according to the first embodiment. Referring to FIG. 2, a connection mechanism 20 includes external connection terminals 21 provided on the semiconductor device 12 (hereinafter referred to as "device-side terminals 21") and external connection terminals 26 provided in the circuit board 11 (hereinafter referred to as "board-side terminals 26").

Each of the device-side terminals 21 includes a base body 22 formed of a convex (or protrusive) conductor and carbon nanotubes (hereinafter abbreviated as "CNTs") 23 each having its base part fixed to the base body 22 through an underlayer 24 and extending in a direction substantially perpendicular to the surface of the base body 22.

On the other hand, each of the board-side terminals 26 is formed of a conductor and has a columnar concave (intrusive) part (or recess) 26a open in the upward direction formed therein. The conductive material is not limited in particular, but is preferably a high-conductivity material such as Cu, Al, Pd, Ti, or Au.

Each CNT 23 of the device-side terminals 21 has the end thereof in contact with the inner wall face, particularly a sidewall face 26b, of the concave part 26a of the corresponding board-side terminal 26. Thus, the device-side terminals 21 are electrically connected to the corresponding board-side terminals 26 through the conductive CNTs 23.

Figure 3A:
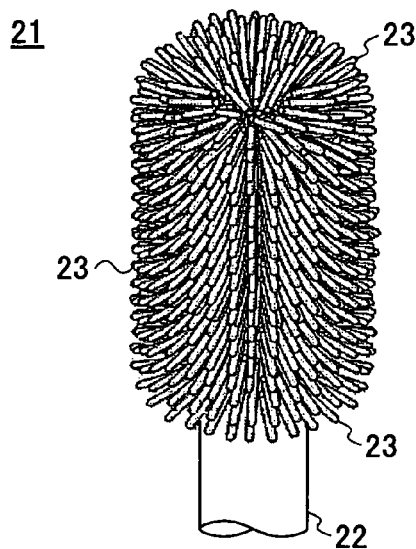
FIG. 3A is an enlarged perspective view of a device-side terminal according to the first embodiment of the present invention.
Figure 3B:
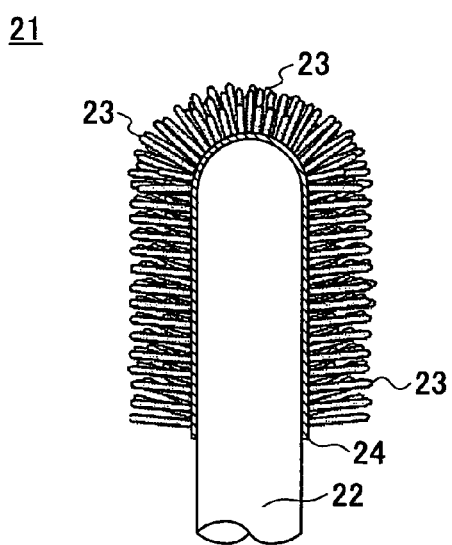
FIG. 3B is a perspective cross-sectional view of the device-side terminal according to the first embodiment of the present invention, showing the inside thereof.

Next, a detailed description is given, with reference to FIGS. 3A and 3B as well as FIG. 2, of a structure of the device-side terminal 21. FIG. 3A is an enlarged perspective view of the device-side terminal 21. FIG. 3B is a perspective cross-sectional view of the device-side terminal 21, showing the inside thereof. In FIGS. 3A and 3B, the device-side terminal 21 is shown in a position vertically reverse to that in FIG. 2 for convenience of description.

The device-side terminal 21 is formed of the base body 22, the underlayer 24 covering the surface of the base body 22, and the CNTs 23 extending in a direction substantially perpendicular to the surface of the base body 22 on the underlayer 24. Where the base parts of the CNTs 23 are fixed to the underlayer 24, there are particulates of catalyst metal serving as the starting points of growth of the CNTs 23. The particulates are so fine that a graphical illustration thereof is omitted here. Further, the particulates of catalyst metal may be positioned at the ends of the CNTs 23 depending on the growth mode of the CNTs 23.

The base body 22 is not limited to a particular shape. For example, the base body 22 has a columnar shape with its end shaped like a hemisphere. The base body 22 is formed of a metal material. In particular, it is preferable that the base body 22 be formed of a metal material of low resistivity, such as Cu, Al, Pd, Ti, and Au.

The underlayer 24 has a film thickness of, for example, 1 nm to 10 nm, and is formed of a metal material selected from the group consisting of, for example, Ti, Mo, V, Nb, and W.

Each of the CNTs 23 has its base part fixed to the base body 22 through the underlayer 24, and linearly extends outward in a direction substantially perpendicular to the surface of the base body 22. The CNT 23 may be either a single-walled CNT (SWCNT), which is a cylindrically formed graphite sheet formed of six-membered rings each formed of $sp^2$-bonded carbon atoms (a so-called graphene sheet), or a multi-walled CNT (MWCNT), which is cylindrically formed multiple graphene sheets. The SWCNT is approximately 0.4 nm to 4 nm in diameter, and is easily bendable. Accordingly, a greater SWCNT proportion makes it easier to insert the device-side terminal 21 into the corresponding concave board-side terminal 26. Further, since the CNT 23 deforms along the sidewall face 26a of the board-side terminal 26, the CNT 23 is in good contact with the sidewall face 26b of the board-side terminal 26. On the other hand, the MWCNT is approximately 2 nm to 100 nm in diameter and has a metallic property, which reduces contact resistance with the board-side terminal 26. Further, as the MWCNT becomes larger in diameter, its modulus of elasticity increases.

Accordingly, the CNTs 23 formed on the surface of the base body 22 preferably include both SWCNT and MWCNT in combination. As a result, it is possible to simultaneously realize easiness of insertion of the device-side terminal 21 into the board-side terminal 26, and an increase in the mechanical strength and reduction in the contact resistance of the device-side terminal 21.

The length of the CNT 23 is suitably selected (determined) in accordance with the diameter of the base body 22 and the diameter (inside diameter) of the concave part 26a of the board-side terminal 26. Specifically, it is preferable that the length of the CNT 23 be greater than (the diameter [inside diameter] of the concave part 26a of the board-side terminal 26–the diameter of the device-side terminal 21)/2. Determining the length of the CNT 23 in this manner causes the CNT 23 to be in good contact with the sidewall face 26b of the board-side terminal 26, so that it is possible to reduce the electrical resistance between the device-side terminal 21 and the board-side terminal 26.

Further, the number of CNTs 23 is suitably selected (determined) in accordance with the size of the device-side terminal 21 and the size of the board-side terminal 26. As the device-side terminal 21 and the board-side terminal 26 become finer, the number of CNTs 23 may be smaller, and may be even one.

The density of the CNTs 23 is preferably $10^{10}$ to $10^{13}$ CNTs per unit area ($cm^2$). Determining the density of the CNTs 23 in this range makes it easier for the CNTs 23 to grow in directions substantially perpendicular to the surface of the base body 22, increases the maximum amount of current conductable, and also causes mechanical strength to be extremely high. Accordingly, a good connection structure is achieved.

On the other hand, the cross-sectional shape of the concave part 26a of each board-side terminal 26 parallel to the surface of the circuit board 11 is not limited to a circular shape, and may be other shapes such as an elliptic shape and a rectangular shape. The concave part 26a of the board-side terminal 26 is provided so as to correspond to the cross-sectional shape of the device-side terminal 21. Each board-side terminal 26 is connected to other semiconductor devices 12 or the passive elements 13 via electrically connected interconnects (not graphically illustrated).

Figure 4:
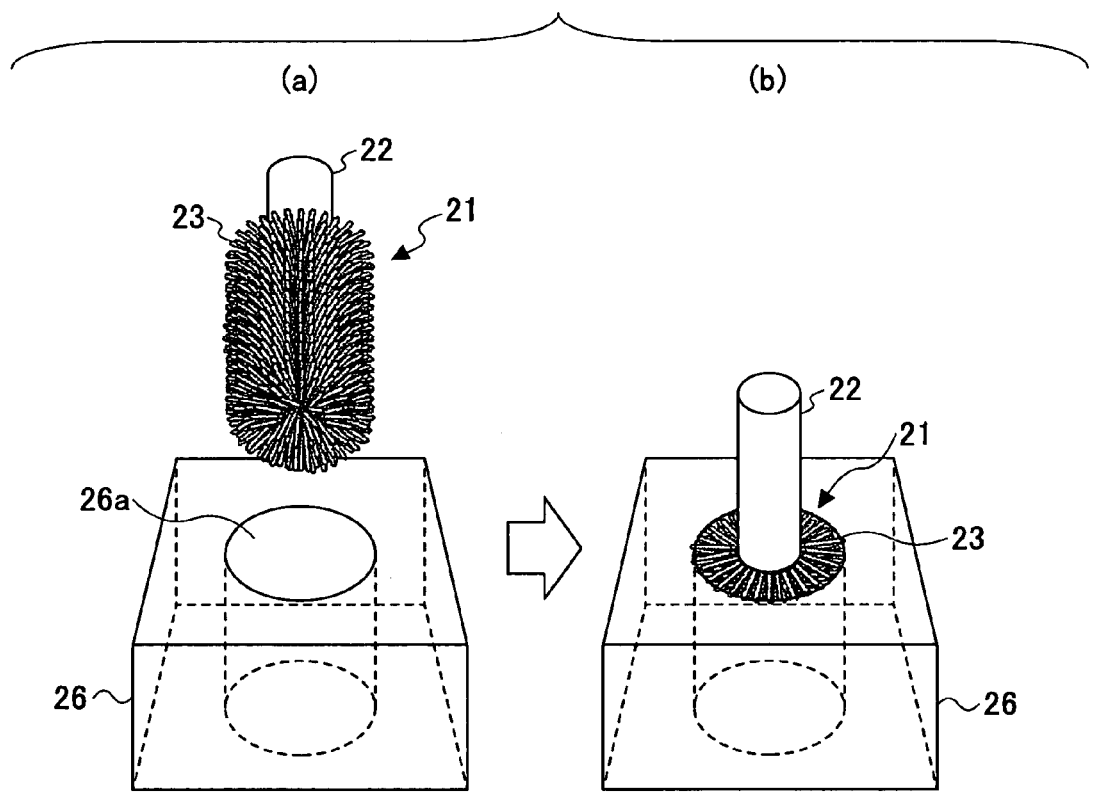
FIG. 4 is a diagram for illustrating attachment and detachment of the device-side terminal and a board-side terminal of the first example of the connection mechanism according to the first embodiment of the present invention.

FIG. 4 is a diagram for illustrating attachment and detachment of the device-side terminal 21 and the board-side terminal 26 of the connection mechanism 20. For convenience of description, only the device-side terminal 21 and the board-side terminal 26 are shown.

Referring to FIG. 4, in the case of inserting the device-side terminal 21 into the board-side terminal 26, the device-side terminal 21 is positioned with respect to the board-side terminal 26 as shown in (a) of FIG. 4. Then, as shown in (b) of FIG. 4, the device-side terminal 21 is moved downward so as to be inserted into the concave part 26a of the board-side terminal 26. Further, in the case of pulling out the device-side terminal 21, the device-side terminal 21 may be simply pulled upward. Since the CNTs 23 having flexibility and elasticity are formed on the surface of the device-side terminal 21, it is possible to insert and pull out the device-side terminal 21 with smoothness and ease.

Figure 5A:
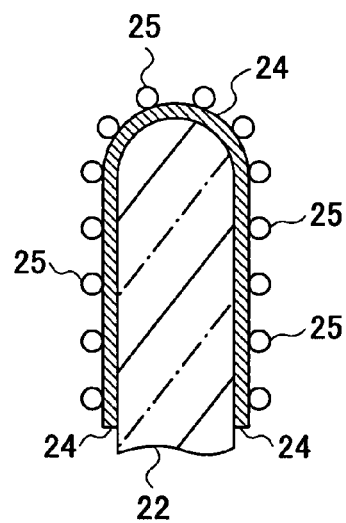
FIGS. 5A and 5B are diagrams showing a method of manufacturing the first example of the connection mechanism according to the first embodiment of the present invention.
Figure 5B:
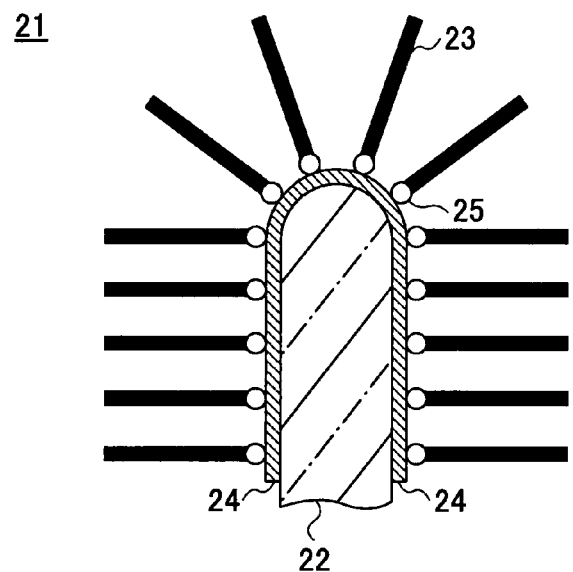

Next, a description is given, with reference to FIGS. 5A and 5B, of a method of manufacturing the connection mechanism 20. The board-side terminals 26 may be formed on the surface of the circuit board 11 using a known method, of which a description is omitted. A description is given below of a method of forming the device-side terminals 21.

First, in the process of FIG. 5A, the underlayer 24 covering the surface of the base body 22 of the device-side terminal 21 is formed by vacuum evaporation or sputtering in an inert gas atmosphere or an oxygen gas atmosphere. Specifically, the underlayer 24 is formed to be 0.5 nm to 50 nm in thickness using a metal material selected from the group consisting of, for example, Ti, Mo, V, Nb, and W.

In the process of FIG. 5A, a particulate catalyst layer 25 is formed on the underlayer 24 by electroless plating or particulate deposition. The particulate catalyst layer 25 is formed as a result of accumulation of multiple particulates of a transition metal such as Co, Ni, Fe, or Mo or an intermetallic compound containing at least one of these transition metals on the surface of the underlayer 24. The particulates have an average particle size (diameter) preferably in the range of 0.4 nm to 20 nm (more preferably, 0.4 nm to 5 nm). Since the CNTs 23 are formed to have substantially the same diameters as the sizes of the corresponding particulates, it is possible to control the diameters of the CNTs 23 by thus controlling the particle sizes of the particulates.

As described above, it is possible to selectively form SWCNTs and MWCNTs by controlling the particle sizes of the particulates. In the case of forming SWCNTs, the particulates are caused to have particle sizes in the range of 0.4 nm to 4 nm. In the case of forming MWCNTs, the particulates are caused to have particle sizes in the range of 1 nm to 100 nm.

In place of the particulate catalyst layer 25, a catalyst layer of a continuous film may be formed by vapor deposition or sputtering. The continuous-film catalyst layer may employ the same material as the particulate catalyst layer 25. The continuous-film catalyst layer is, for example, 0.5 nm to 30 nm in thickness. Further, by suitably selecting (determining) the thickness of the continuous-film catalyst layer, it is possible to control the range of the diameter distribution of the CNTs 23, and the ratio of SWCNTs and the ratio of MWCNTs to the CNTs 23.

Next, in the process of FIG. 5B, the CNTs 23 are formed by thermal CVD or plasma CVD. Specifically, for example, in the case of using thermal CVD, a hydrocarbon gas such as acetylene or methane and a hydrogen gas are fed as a material gas and a carrier gas, respectively, the heating temperature is set at 400° C. to 900° C., preferably 400° C. to 600° C., and the pressure is set at 1 kPa. Under these conditions, the CNTs 23 grow from the particulate catalyst layer 25 in directions substantially perpendicular to the surface of the base body 22.

As described above, the diameters of the CNTs 23 depend on the sizes of the corresponding particulates, and it is possible to control the numbers of walls of the CNTs 23 with the amount of carbon contained in the material gas and/or the flow rate of the material gas. Further, sublimated fullerene or alcohol gasified by bubbling may also be used as the material gas.

Further, in the case of plasma CVD, for example, the CNTs 23 may be formed by feeding the above-described hydrocarbon gas or gasified alcohol as a material gas and forming a plasma by applying high-frequency power.

According to thermal CVD or plasma CVD, the CNTs 23 are formed by the material gas coming into contact with the particulate catalyst layer. Accordingly, it is possible to form the CNTs 23 with ease even if the base body 22 has a complicated shape. Besides the above-described methods, a known method may be used to form the CNTs 23. Thereby, the device-side terminals 21 are formed.

According to the connection mechanism 20, the ends of the CNTs 23 formed on the base bodies 22 of the device-side terminals 21 come into contact with the sidewall faces 26b of the corresponding board-side terminals 26. As a result, the device-side terminals 21 are electrically connected to the corresponding board-side terminals 26. Since the CNTs 23 have both flexibility and extremely high mechanical strength, the semiconductor device 12 and the circuit board 11 can be repeatedly attached to and detached (removed) from each other. That is, at the time of attaching the semiconductor device 12 to the circuit board 11, the semiconductor device 12 and the circuit board 11 are electrically connected to each other by merely inserting the device-side terminals 21 into the corresponding board-side terminals 26. Further, at the time of removing the semiconductor device 12 from the circuit board 11, it is only necessary to pull out the semiconductor device 12 from the circuit board 11. Since the CNTs 23 of the device-side terminals 21 are hardly damaged at the time of attachment and detachment, it is possible to re-attach the removed semiconductor device 12 to the circuit board 11. Accordingly, when the semiconductor device 12 fails or is defective, the semiconductor package 10 is made usable by only replacing the semiconductor device 12. Likewise, in the case where the circuit board 11 fails or is defective, the semiconductor package 10 is also made usable by only removing the semiconductor device 12 and replacing or repairing the circuit board 11. Compared with the case of bonding the semiconductor device 12 and the circuit board 11 in a conventional manner through solder bumps, it is possible to replace the semiconductor device 12 or the circuit board 11 with extreme ease, and it is possible to repeatedly attach and detach the semiconductor device 12.

Further, according to the connection mechanism 20, the device-side terminals 21 and the board-side terminals 26 are mechanically fixed to each other through the CNTs 23.

Accordingly, there is no need to separately provide a support body for supporting or fixing the semiconductor device 12.

Next, a description is given of a second example of the connection mechanism, in which CNTs are provided on the board-side terminal side.

Figure 6:
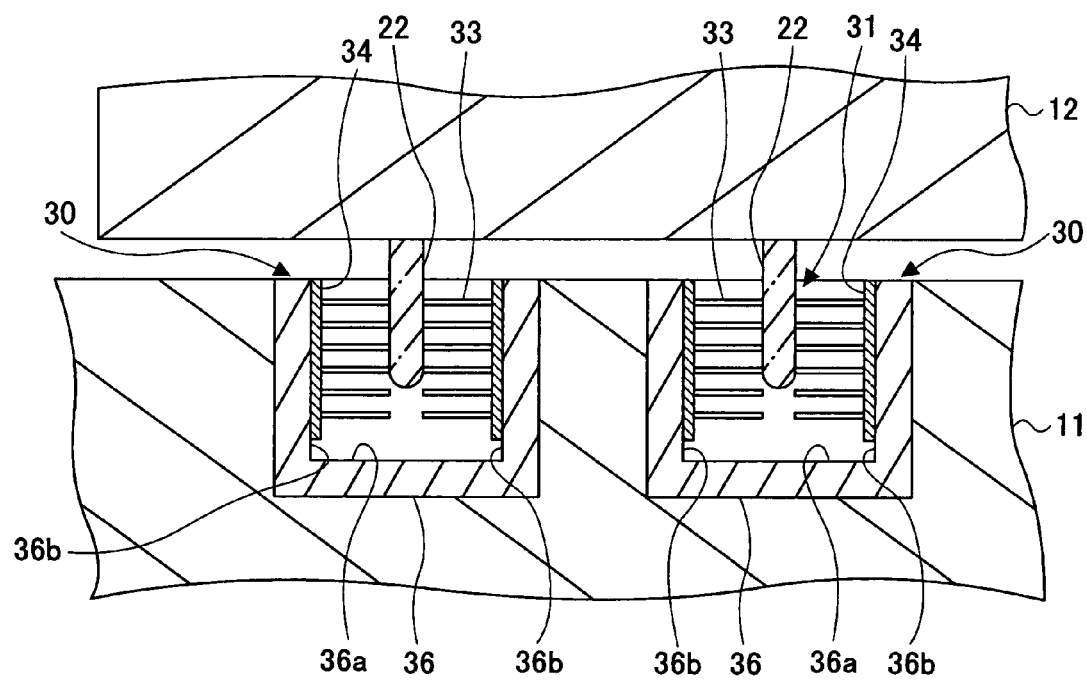
FIG. 6 is a cross-sectional view of a second example of the connection mechanism according to the first embodiment of the present invention.

FIG. 6 is a cross-sectional view of a connection mechanism 30. In FIG. 6, parts corresponding to those described above are referred to by the same reference numerals, and a description thereof is omitted.

Referring to FIG. 6, the connection mechanism 30 includes device-side terminals 31 serving as external connection terminals provided at the bottom of the semiconductor device 12 and board-side terminals 36 having respective concave parts (recesses) 36a provided in the circuit board 11. Each of the device-side terminals 31 is formed of the convex (protrusive) base body 22 of a metal material. On the other hand, CNTs 33 are provided on the surface of a sidewall face 36b of the concave part 36a of each of the board-side terminals 36.

Figure 7A:
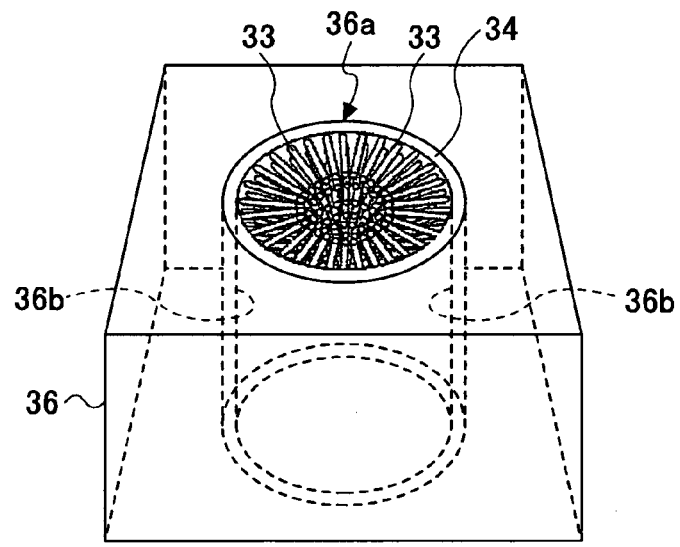
FIG. 7A is an enlarged perspective view of a board-side terminal according to the first embodiment of the present invention.
Figure 7B:
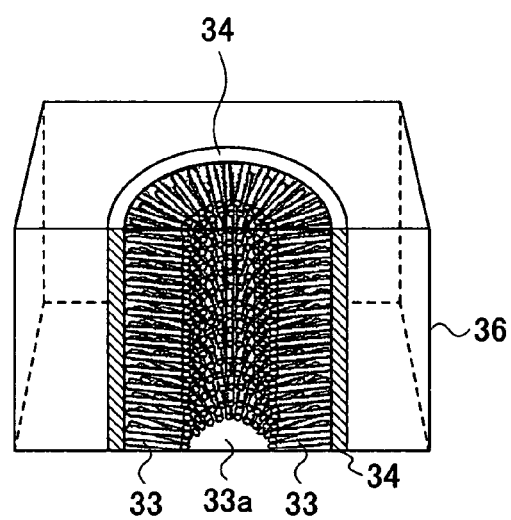
FIG. 7B is a perspective cross-sectional view of the board-side terminal according to the first embodiment of the present invention, showing the inside thereof.

Next, a detailed description is given, with reference to FIGS. 7A and 7B, of a structure of the board-side terminal 36. FIG. 7A is an enlarged perspective view of the board-side terminal 36. FIG. 7B is a perspective cross-sectional view of the board-side terminal 36, showing the inside thereof.

The board-side terminal 36 includes the concave part 36a provided in a conductor and open in the upward direction and the multiple CNTs 33 fixed to the sidewall face 36b of the concave part 36a through an underlayer 34. The board-side terminal 36 is formed of a conductive material, for example, the same material as the board-side terminal 26 of the above-described connection mechanism 20.

The concave part 36a is open in the upward direction, and has a circular cross-sectional shape parallel to the surface of the circuit board 11. The concave part 36a may also have other cross-sectional shapes such as an elliptic shape and a rectangular shape.

The underlayer 34 is formed on the sidewall face 36b of the concave part 36a. The underlayer 34 may not be provided on the bottom face of the concave part 36a. The thickness and material of the underlayer 34 may be determined the same as those of the underlayer 24 in the above-described connection mechanism 20.

Each of the CNTs 33 has its base part fixed to the sidewall face 36b of the concave part 36a through the underlayer 34, and extends in a direction substantially perpendicular to the surface of the sidewall face 36b toward the center of the concave part 36a. Further, the CNTs 33 are prevented from being excessively long. This is because if the CNTs 33 reach the vicinity of the center of the concave part 36a, the density of the CNTs 33 (the number of CNTs 33 per unit cross-sectional area) excessively increases so that the CNTs 33 change the direction of growth. By appropriately determining the lengths of the CNTs 33, an opening part (or hole) is formed around the center of the concave part 36a along its depth directions. This opening part has a substantially columnar shape and has a central axis along the depth directions. The opening part serves as a guide groove at the time of inserting the device-side terminal 31 into the board-side terminal 36.

The CNTs 33 have substantially the same configuration as the CNTs 23 of the above-described connection mechanism 20. That is, the CNTs 33 may be SWCNTs or MWCNTs or contain both SWCNTs and MWCNTs. It is preferable to combine both SWCNTs and MWCNTs in terms of the contact and electrical connection (continuity) between the device-side terminal 31 and the CNTs 33.

Figure 8:
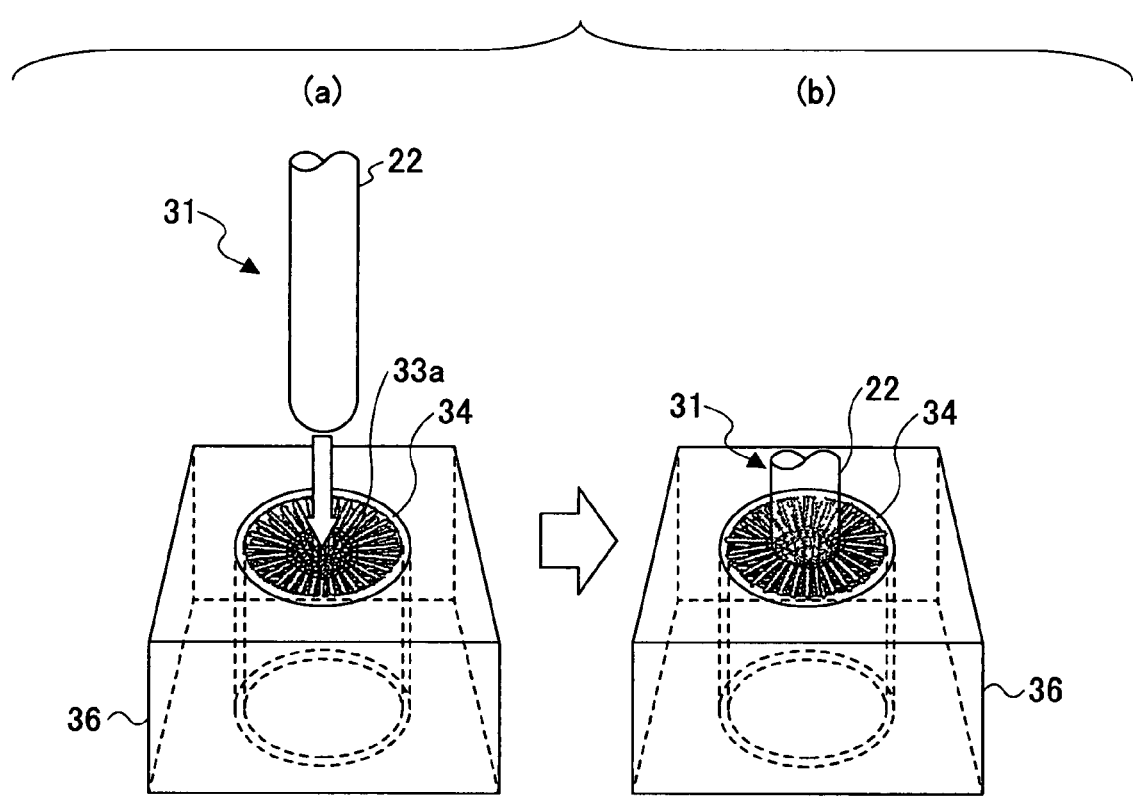
FIG. 8 is a diagram for illustrating attachment and detachment a device-side terminal and the board-side terminal of the second example of the connection mechanism according to the first embodiment of the present invention.

FIG. 8 is a diagram for illustrating attachment and detachment the device-side terminal 31 and the board-side terminal 36 of the connection mechanism 30. For convenience of description, only the device-side terminal 31 and the board-side terminal 36 are shown.

Referring to FIG. 8, in the case of inserting the device-side terminal 31 into the board-side terminal 36, the device-side terminal 31 is positioned with respect to the board-side terminal 36 as shown in (a) of FIG. 8. Then, as shown in (b) of FIG. 8, the device-side terminal 21 is moved downward so as to be inserted into the opening part formed at the ends of the CNTs 33 of the board-side terminal 36. Further, in the case of pulling out the device-side terminal 31, the device-side terminal 31 may be simply pulled upward. Since the CNTs 33 having flexibility and elasticity are formed on the board-side terminal 36, it is possible to insert and pull out the device-side terminal 31 with smoothness and ease.

Referring back to FIG. 6, a description is given of a method of manufacturing the connection mechanism 30. According to the method of manufacturing the connection mechanism 30, the underlayer 34 is provided on the sidewall face 36b of the concave part 36a of each board-side terminal 36, and then a particulate catalyst layer or a catalyst layer of a continuous film (not graphically illustrated) is provided. Then, the CNTs 33 are caused to grow on the sidewall face 36b. The same conditions as those for forming the CNTs 23 on the surfaces of the base bodies 22 of the device-side terminals 21 in the above-described connection mechanism 20 may be employed for this manufacturing method.

According to the connection mechanism 30, the ends of the CNTs 33 provided on the sidewall faces 36b of the board-side terminals 36 come into contact with the surfaces of the corresponding device-side terminals 31, so that the board-side terminals 36 and the device-side terminals 31 are electrically connected to each other. Since the board-side terminals 36 and the base bodies 22 of the device-side terminals 31 are in contact through the CNTs 33, and the CNTs 33 have flexibility and sufficient mechanical strength, the semiconductor device 12 can be attached to and detached from the circuit board 11 by merely inserting the device-side terminals 31 into the board-side terminals 36 and pulling out the device-side terminals 31 from the board-side terminals 36. Accordingly, in the case of failure of the semiconductor device 12, the semiconductor package 10 is made usable by merely replacing the semiconductor device 12. Compared with the case of bonding the semiconductor device 12 and the circuit board 11 in a conventional manner through solder bumps, it is possible to replace the semiconductor device 12 with extreme ease.

Next, a description is given of a third example of the connection mechanism according to this embodiment, in which CNTs are provided on both the device-side terminal side and the board-side terminal side.

Figure 9:
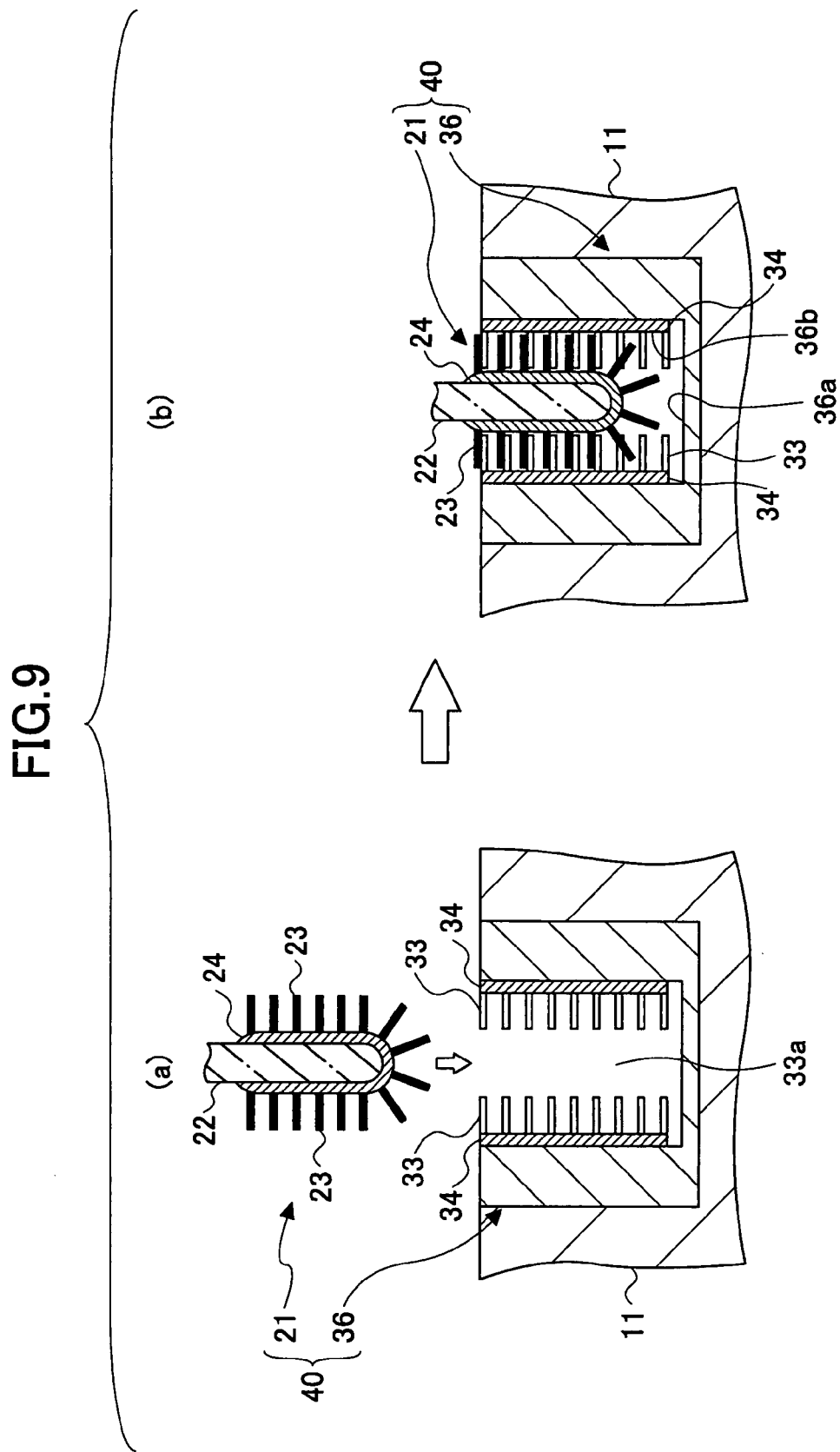
FIG. 9 is a cross-sectional view of a third example of the connection mechanism for illustrating attachment and detachment of a device-side terminal and a board-side terminal thereof according to the first embodiment of the present invention.

FIG. 9 is a cross-sectional view of a connection mechanism 40 for illustrating attachment and detachment of a device-side terminal and a board-side terminal thereof. In FIG. 9, parts corresponding to those described above are referred to by the same reference numerals, and a description thereof is omitted.

Referring to FIG. 9, the connection mechanism 40 includes the device-side terminal 21 having the CNTs 23 provided on the surface of its base body 22 and the board-side terminal 36 having the CNTs 33 provided on the sidewall face 36b of its concave part 36a. The connection mechanism 40 is the combination of the device-side terminal 21 of the connection mechanism 20 shown in FIG. 3A and the board-side terminal 36 of the connection mechanism 30 shown in FIG. 7A. The connection mechanism 40 may have two or more device-side terminals 21 and two or more board-side terminals 36 although only one each is shown in FIG. 9.

The CNTs 23 extending from the base body 22 of the device-side terminal 21 and the CNTs 33 extending from the sidewall face 36b of the board-side terminal 36 come into contact with each other so that the device-side terminal 21 and the board-side terminal 36 are electrically connected to each other. The ends of the CNTs 23 of the device-side terminal 21 may come into contact with the sidewall face 36b of the board-side terminal 36 or the ends of the CNTs 33 of the board-side terminal 36 may come into contact with the surface of the base body 22 of the device-side terminal 21 the same as in the connection mechanism 20 or the connection mechanism 30.

The device-side terminal 21 and the board-side terminal 36 are attached to and detached from each other in the same manner as in the connection mechanism 20 and the connection mechanism 30. That is, in the case of inserting the device-side terminal 21 into the board-side terminal 36, the device-side terminal 21 may be positioned with respect to the board-side terminal 36 as shown in (a) of FIG. 9, and then the device-side terminal 21 may be moved downward as shown in (b) of FIG. 9. Further, in the case of extracting the device-side terminal 21, the device-side terminal 21 may be simply pulled upward.

The method of forming the device-side terminal 21 and the method of forming the board-side terminal 36 are substantially the same as in the connection mechanism 20 and the connection mechanism 30, respectively, and accordingly, a description thereof is omitted.

According to the connection mechanism 40, the CNTs 23 of the device-side terminal 21 and the CNTs 33 of the board-side terminal 36 come into contact with each other so that the device-side terminal and the board-side terminal 36 are electrically connected to each other. Accordingly, the connection mechanism 40 produces the same effects as the connection mechanism 20. Further, since the CNTs 23 and the CNTs 33 come into contact, the contact resistance is further reduced. Further, the device-side terminal 21 and the board-side terminal 36 are firmly joined mechanically. As a result, the joining of the semiconductor device 12 and the circuit board 11 is strengthened.

Next, a description is given of a fourth example of the connection mechanism, which is different from the connection mechanism 40 (FIG. 9) in the directions of extension of CNTs.

Figure 10:
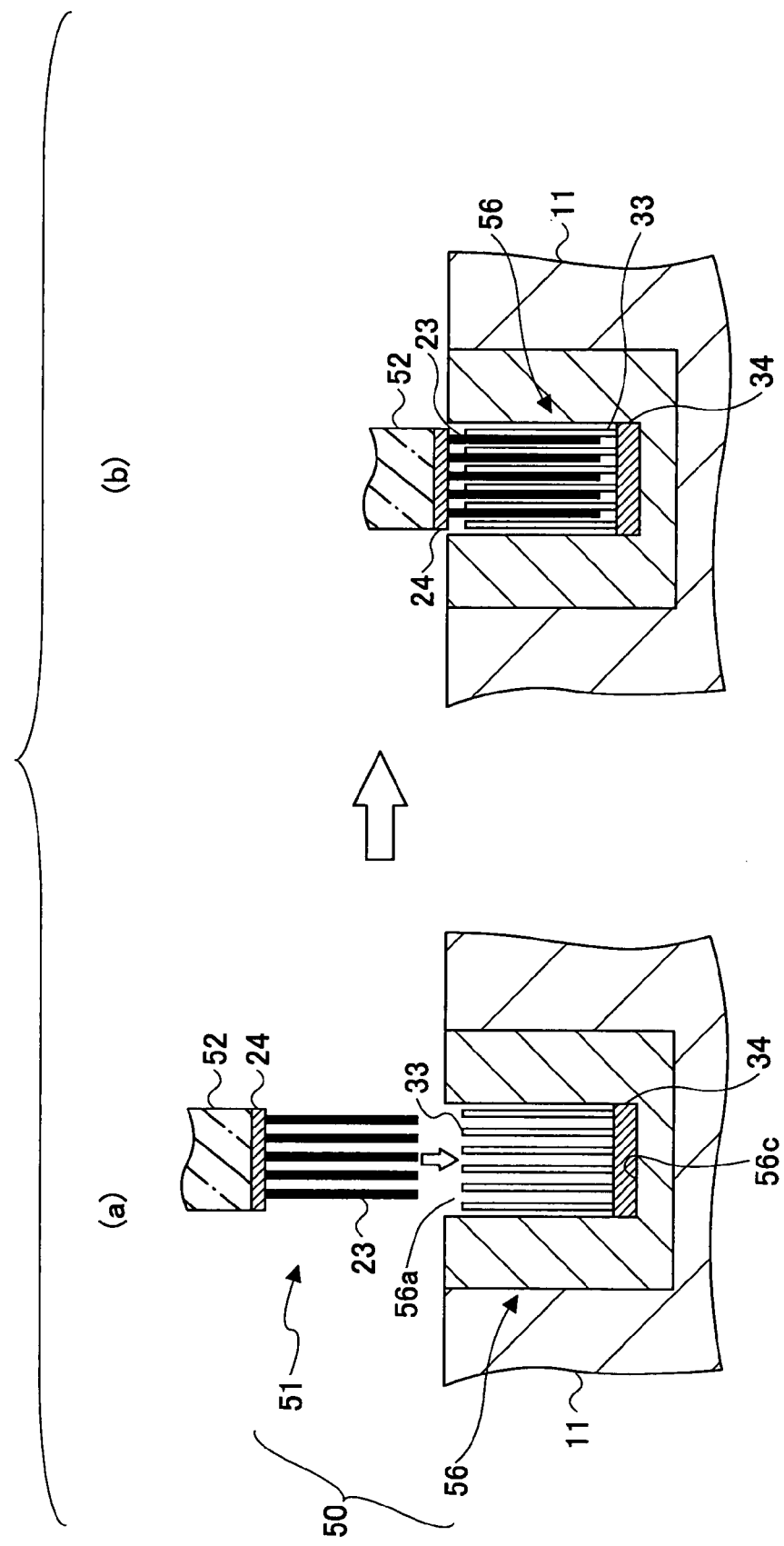
FIG. 10 is a cross-sectional view of a fourth example of the connection mechanism for illustrating attachment and detachment of a device-side terminal and a board-side terminal thereof according to the first embodiment of the present invention.

FIG. 10 is a cross-sectional view of a connection mechanism 50 for illustrating attachment and detachment of a device-side terminal and a board-side terminal thereof. In FIG. 10, parts corresponding to those described above are referred to by the same reference numerals, and a description thereof is omitted.

Referring to FIG. 10, the connection mechanism 50 includes a device-side terminal 51 having the CNTs 23 provided at an end of a base body 52 and a board-side terminal 56 having the CNTs 33 provided on a bottom face 56c of a concave part (recess) 56a. The connection mechanism 50 may have two or more device-side terminals 51 and two or more board-side terminals 56 although only one each is shown in FIG. 10.

The device-side terminal 51 includes the base body 52, which is a conductor, and the CNTs 23 having their base parts fixed to the flat end of the base body 52 through the underlayer 24 and extending in a direction substantially perpendicular to the surface of the end of the base body 52. The CNTs 23 extend substantially parallel to the direction of insertion of the device-side terminal 51 (into the board-side terminal 56).

The board-side terminal 56 includes the underlayer 34 provided on the bottom face 56c of the concave part 56a of a conductor and the CNTs 33 having their base parts fixed to the underlayer 34 and extending in a direction substantially perpendicular to the bottom face 56c of the concave part 56a. The CNTs 33 extend upward, that is, substantially parallel to the direction of insertion of the device-side terminal 51.

As shown in (b) of FIG. 10, when the device-side terminal 51 is inserted into the board-side terminal 56, the CNTs 23 of the device-side terminal 51 and the CNTs 33 of the board-side terminal 56 come into contact with each other, so that the device-side terminal 51 and the board-side terminal 56 are electrically connected to each other. Since the CNTs 23 and the CNTs 33 extend substantially parallel to each other, the CNTs 23 and the CNTs 33 come into contact, attracting each other along their respective longitudinal directions. As a result, the area of contact of the CNTs 23 and the CNTs 33 increases so as to reduce the contact resistance of the device-side terminal 51 and the board-side terminal 56. The method of forming the device-side terminal 51 and the method of forming the board-side terminal 56 are substantially the same as in the connection mechanism 20 and the connection mechanism 30, respectively, and accordingly, a description thereof is omitted.

The connection mechanism 50 produces the same effects as the connection mechanism 40. Further, according to the connection mechanism 50, the CNTs 23 of the device-side terminal 51 and the CNTs 33 of the board-side terminal 56 come into contact parallel to each other along their longitudinal directions. Accordingly, it is possible to further reduce contact resistance. At the same time, the device-side terminal 51 and the board-side terminal 56 are more firmly joined mechanically.

The cross-sectional shape of the device-side terminal 51 perpendicular to the direction of insertion of the bundle of the CNTs 23 is not limited to a circular shape, and may be any shape as long as it and the cross-sectional shape of the concave part 56a of the board-side terminal 56 correspond to each other.

Next, a description is given of a fifth example of the connection mechanism, which is different from the connection mechanism 50 (FIG. 10) in that the CNTs 33 on the board-side terminal side are provided on the surface of a board-side terminal.

Figure 11:
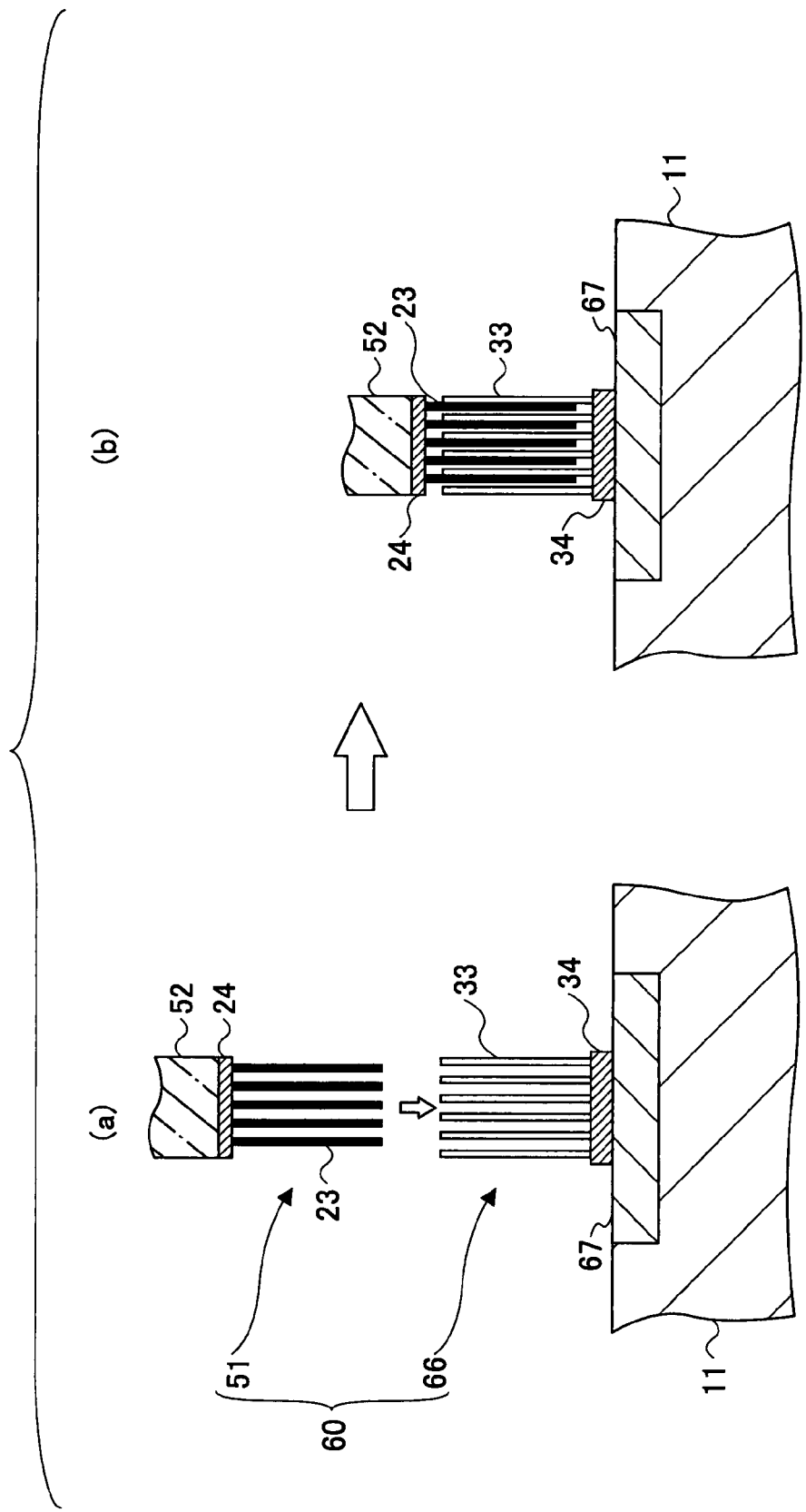
FIG. 11 is a cross-sectional view of a fifth example of the connection mechanism for illustrating attachment and detachment of a device-side terminal and a board-side terminal thereof according to the first embodiment of the present invention.

FIG. 11 is a cross-sectional view of a connection mechanism 60 for illustrating attachment and detachment of a device-side terminal and a board-side terminal thereof. In FIG. 11, parts corresponding to those described above are referred to by the same reference numerals, and a description thereof is omitted.

Referring to FIG. 11, the connection mechanism 60 includes the device-side terminal 51 having the CNTs 23 provided at the end of the base body 52 and a board-side terminal 66 having the CNTs 33 provided on the surface of an electrode 67. The connection mechanism 60 may have two or more device-side terminals 51 and two or more board-side terminals 66 although only one each is shown in FIG. 11.

The device-side terminal 51 is the same as in the connection mechanism 50, and accordingly, a description thereof is omitted. The board-side terminal 66 includes the underlayer 34 provided on the surface of the electrode 67 on the surface of the circuit board 11 and the CNTs 33 having their base parts fixed to the underlayer 34 and extending in a direction substantially perpendicular to the surface of the underlayer 34. A restriction on the direction of growth, such as the concave part 56a in the connection mechanism 50, is not provided for the CNTs 33. However, as described above, the CNTs 33 act on one another so as to grow substantially upward.

As shown in (b) of FIG. 11, when the device-side terminal 51 is inserted into the board-side terminal 66, the CNTs 23 of the device-side terminal 51 and the CNTs 33 of the board-side terminal 66 come into contact with each other so that the device-side terminal 51 and the board-side terminal 66 are electrically connected to each other. The CNTs 23 and the CNTs 33 come into contact, attracting each other along their longitudinal directions. Accordingly, the area of contact increases.

The method of forming the device-side terminal 51 and the method of forming the board-side terminal 66 are substantially the same as in the connection mechanism 20 and the connection mechanism 30, respectively, and accordingly, a description thereof is omitted.

The connection mechanism 60 produces the same effects as the connection mechanism 50. Further, since the board-side terminal 66 is provided on the surface of the circuit board 11, a process gas is smoothly fed at the time of causing the CNTs 33 to grow. Accordingly, it is easier to cause growth of the CNTs 33 than in the case of forming the CNTs 33 on the bottom face of a concave part as in the connection mechanism 50.

The cross-sectional shape of the device-side terminal 51 perpendicular to the direction of insertion of the bundle of the CNTs 23 is not limited in particular, and may be any shape as long as it and the cross-sectional shape of the board-side terminal 56 perpendicular to the direction of insertion of the bundle of the CNTs 33 correspond to each other. Further, a positioning mechanism that positions the device-side terminal 51 and the board-side terminal 66 relative to each other may be provided on the semiconductor device 12 and the circuit board 11.

Next, a description is given of a sixth example of the connection mechanism, which is different from the connection mechanism 50 (FIG. 10) in the direction of extension of CNTs on the board-side terminal side.

Figure 12:
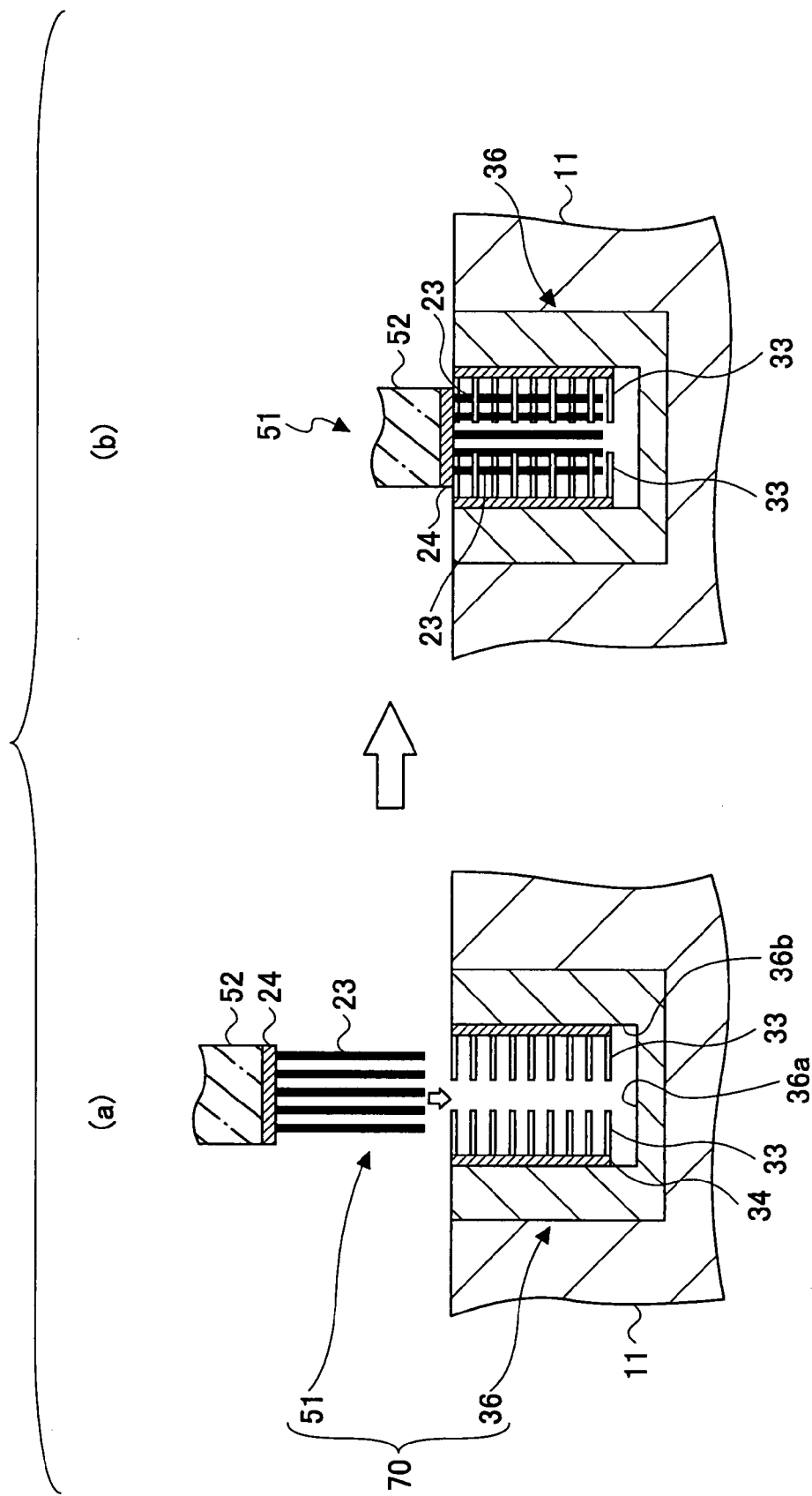
FIG. 12 is a cross-sectional view of a sixth example of the connection mechanism for illustrating attachment and detachment of a device-side terminal and a board-side terminal thereof according to the first embodiment of the present invention.

FIG. 12 is a cross-sectional view of a connection mechanism 70 for illustrating attachment and detachment of a device-side terminal and a board-side terminal thereof. In FIG. 12, parts corresponding to those described above are referred to by the same reference numerals, and a description thereof is omitted.

Referring to FIG. 12, the connection mechanism 70 includes the device-side terminal 51 having the CNTs 23 provided at the end of the base body 52 and the board-side terminal 36 having the CNTs 33 provided on the sidewall face 36b of the concave part 36a. The device-side terminal 51 is the same as the device-side terminal 51 of the connection mechanism 50 shown in FIG. 10, and the board-side terminal 36 is the same as the board-side terminal 36 of the connection mechanism 30 shown in FIG. 7A. The connection mechanism 70 may have two or more device-side terminals 51 and two or more board-side terminals 36 although only one each is shown in FIG. 12.

As shown in (b) of FIG. 12, the CNTs 23 of the device-side terminal 51 and the CNTs 33 of the board-side terminal 36 cross each other substantially at right angles. Each of the CNTs 23 comes into contact with many CNTs 33, while each of the CNTs 33 comes into contact with many CNTs 23. Thus, the device-side terminal 51 and the board-side terminal 36 are electrically connected to each other. The method of forming the device-side terminal 51 and the method of forming the board-side terminal 36 are substantially the same as in the connection mechanism 20 and the connection mechanism 30, respectively, and accordingly, a description thereof is omitted.

The connection mechanism 70 produces substantially the same effects as the connection mechanism 40. Further, since the CNTs 23 of the device-side terminal 51 and the CNTs 33 provided on the sidewall face 36b of the board-side terminal 36 extend in directions to cross each other, the device-side terminal 51 can be inserted into and extracted from the board-side terminal 36 with ease. The cross-sectional shape of the device-side terminal 51 perpendicular to the direction of insertion of the bundle of the CNTs 23 is not limited to a circular shape, and may be any shape as long as it and the cross-sectional shape of the concave part 36a of the board-side terminal 36 correspond to each other.

Next, a description is given of a seventh example of the connection mechanism.

Figure 13:
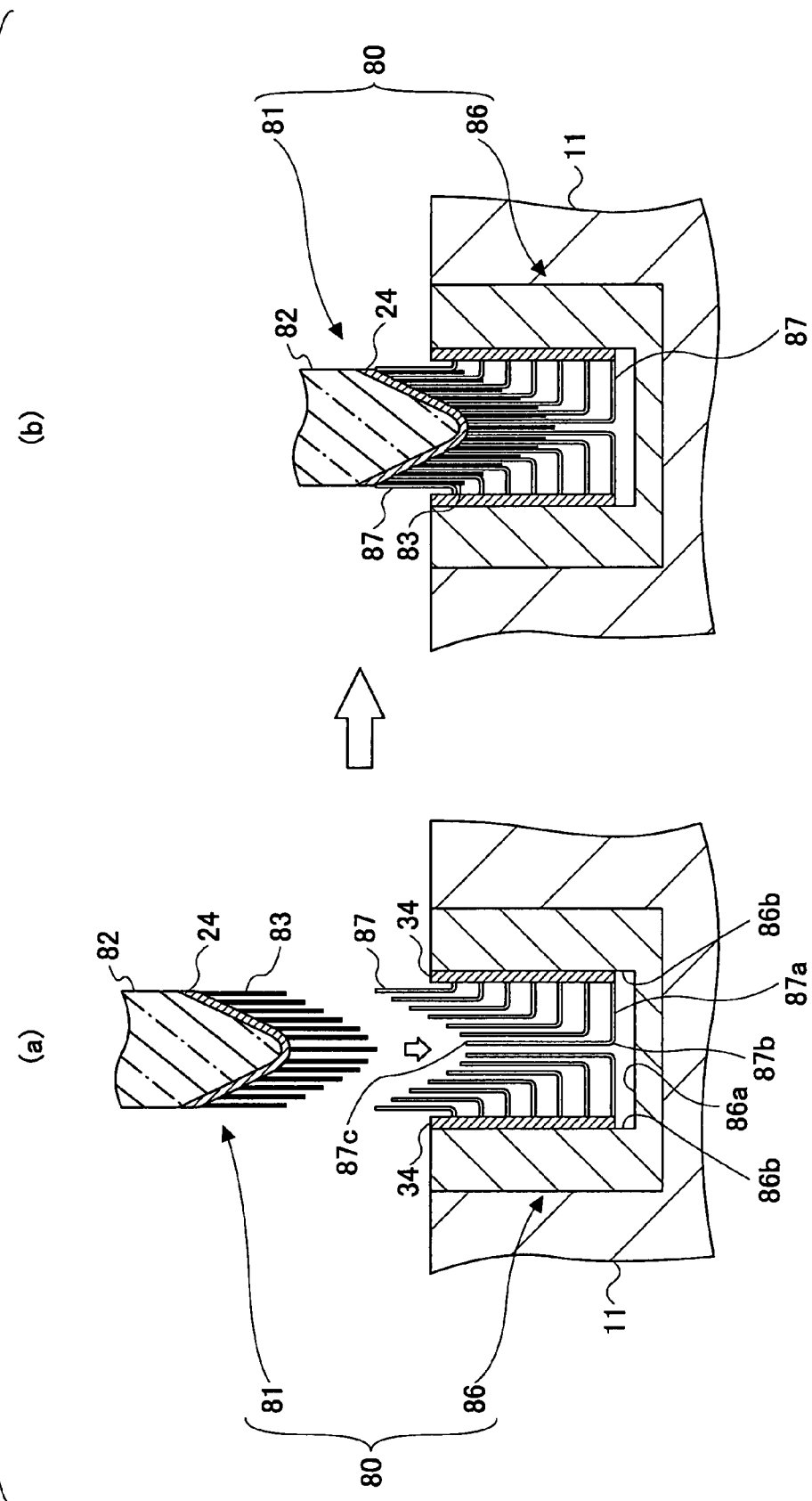
FIG. 13 is a cross-sectional view of a seventh example of the connection mechanism for illustrating attachment and detachment of a device-side terminal and a board-side terminal thereof according to the first embodiment of the present invention.

FIG. 13 is a cross-sectional view of a connection mechanism 80 for illustrating attachment and detachment of a device-side terminal and a board-side terminal thereof. In FIG. 13, parts corresponding to those described above are referred to by the same reference numerals, and a description thereof is omitted.

Referring to FIG. 13, the connection mechanism 80 includes a device-side terminal 81 having CNTs 83 provided at a tapered end of a base body 82 and a board-side terminal 86 having CNTs 87 provided on a sidewall face 86b of a concave part 86a. The connection mechanism 80 may have two or more device-side terminals 81 and two or more board-side terminals 86 although only one each is shown in FIG. 13.

The device-side terminal 81 includes the base body 82, which is a conductor and has a conic end part convex (or tapered) toward the end, and the multiple CNTs 83 having their base parts fixed to the underlayer 24 covering the surface of the end part, and extending along the direction of insertion of the device-side terminal 81. The end part of the bundle of the CNTs 83 has a conic shape, taking over (or matching) the shape of the end part of the base body 82. Such shaping facilitates insertion of the device-side terminal 81 into the board-side terminal 86.

On the other hand, the board-side terminal 86 includes the columnar concave part 86a provided in a conductor. The underlayer 34 is provided on the sidewall face 86b of the concave part 86a. The CNTs 87 are formed on the surface of the underlayer 34 with their base parts being fixed thereto. As shown in (a) of FIG. 13, each of the CNTs 87 includes a base part 87a extending laterally inward near the sidewall face 86b, a bent part 87b bent upward (changing the direction of the lateral extension of the base part 87a) near the center of the concave part 86a, and an end part 87c extending upward. The CNTs 87 are formed by further continuation of growth of the CNTs 33 in the board-side terminal 36 of the above-described connection mechanism 30 shown in FIG. 7A. That is, the density of the CNTs 87 gradually increases as the CNTs 87 extend laterally from the sidewall face 86b. This makes it difficult for the CNTs 87 to grow laterally, so that the CNTs 87 change the direction of growth to grow upward. This self-organizing CNT property is taken advantage of.

As shown in (a) of FIG. 13, the end part of the bundle of the CNTs 87 of the board-side terminal 81 has an inversely conic surface shape. It is possible to form the CNTs 87 into this shape by, for example, causing the CNTs 87 to grow to be longer than the radius of the concave part 86a. This is because the CNTs 87 growing from the sidewall face 86b meet at the center part of the concave part 86a and bend to grow upward because the CNTs 87 have no region to further extend to.

As shown in (b) of FIG. 13, the CNTs 83 of the device-side terminal 81 and the CNTs 87 of the board-side terminal 86 come into contact with each other so that the device-side terminal 81 and the board-side terminal 86 are electrically connected to each other. The CNTs 83 and the CNTs 87 come into contact, attracting each other along their longitudinal directions. Accordingly, the area of contact increases.

The connection mechanism 80 produces the same effects as the connection mechanism 50 (FIG. 10). Further, according to the connection mechanism 80, since the device-side terminal 81 and the board-side terminal 86 have a convex shape and a concave shape, respectively, the device-side terminal 81 is easily inserted into and extracted from the board-side terminal 86.

Next, a description is given of an eighth example of the connection mechanism, in which bundles of CNTs are brought into contact with each other through a metal film.

Figure 14:
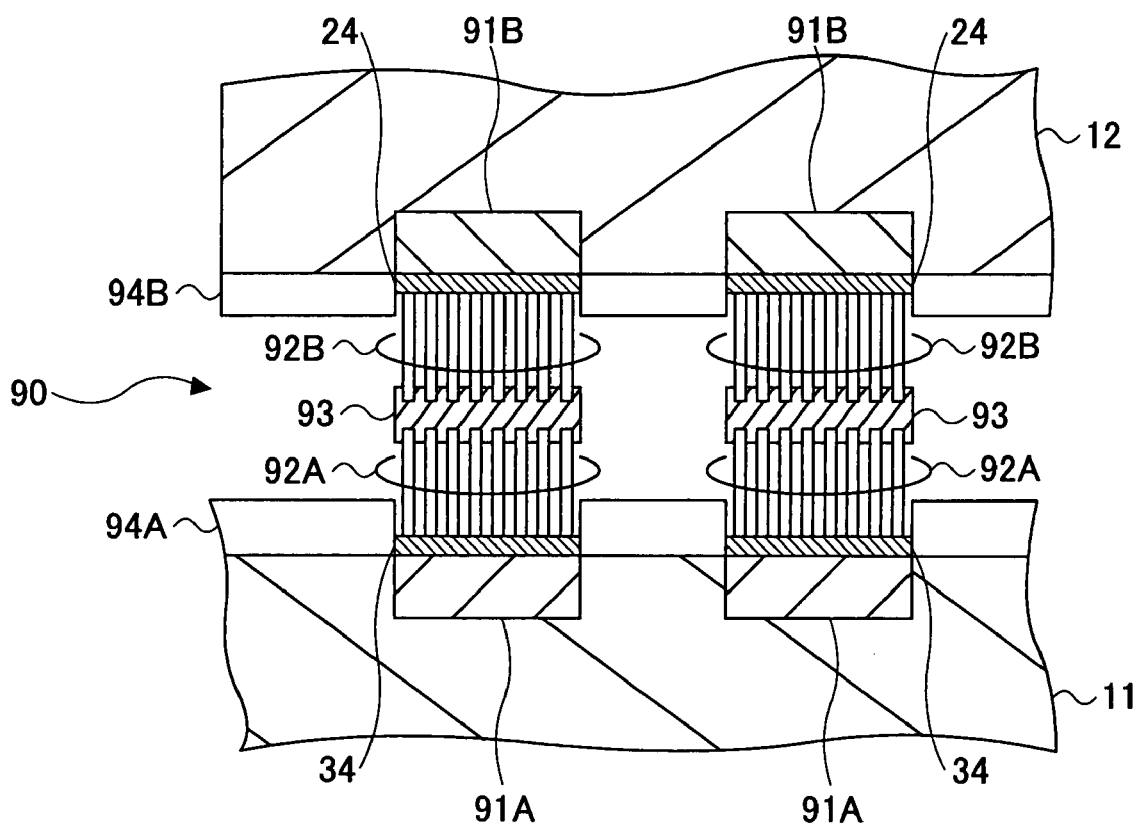
FIG. 14 is a cross-sectional view of an eighth example of the connection mechanism according to the first embodiment of the present invention.

FIG. 14 is a cross-sectional view of a connection mechanism 90. In FIG. 14, parts corresponding to those described above are referred to by the same reference numerals, and a description thereof is omitted.

Referring to FIG. 14, the connection mechanism 90 includes CNT bundles 92B serving as device-side terminals provided on the semiconductor device 12, CNT bundles 92A serving as board-side terminals provided on the circuit board 11, and a low-melting metal layer 93 connecting the end parts of the CNT bundles 92A and 92B.

The CNT bundles 92A and 92B have their base parts fixed to the underlayers 34 and 24 provided on the surfaces of electrodes 91A and 91B of the circuit board 11 and the semiconductor device 12, respectively, and extend in directions substantially perpendicular to the surfaces of the electrodes 91A and 91B, respectively. It is preferable that the CNT bundles 92A and 92B have densities of $10^{10}$ to $10^{13}$ CNTs per unit area ($cm^2$) in terms of good erection.

On the other hand, the low-melting metal layer 93 is, for example, 500 nm in film thickness and formed of a low-melting metal material. The low-melting metal material is formed of at least one metal selected from the group consisting of In, Al, Ga, Ag, Hg, Zn, Cd, Sn, and Tl. The low-melting metal layer 93 can join or separate from each other the CNT bundles 92A and 92B at low temperatures lower than or equal to 400° C.

Since the CNT bundles 92A and 92B have good electrical characteristics and extremely high mechanical strength, the connection mechanism 90 electrically connects and mechanically joins the semiconductor device 12 and the circuit board 11. Further, since the CNT bundles 92A and 92B are joined with the low-melting metal layer 93, the CNT bundles 92A and 92B can be easily attached and detached by heating at low temperature. The method of manufacturing the connection mechanism 90 is substantially the same as the method of manufacturing a ninth example of the connection mechanism described below. Accordingly, a description thereof is omitted.

Figure 15:
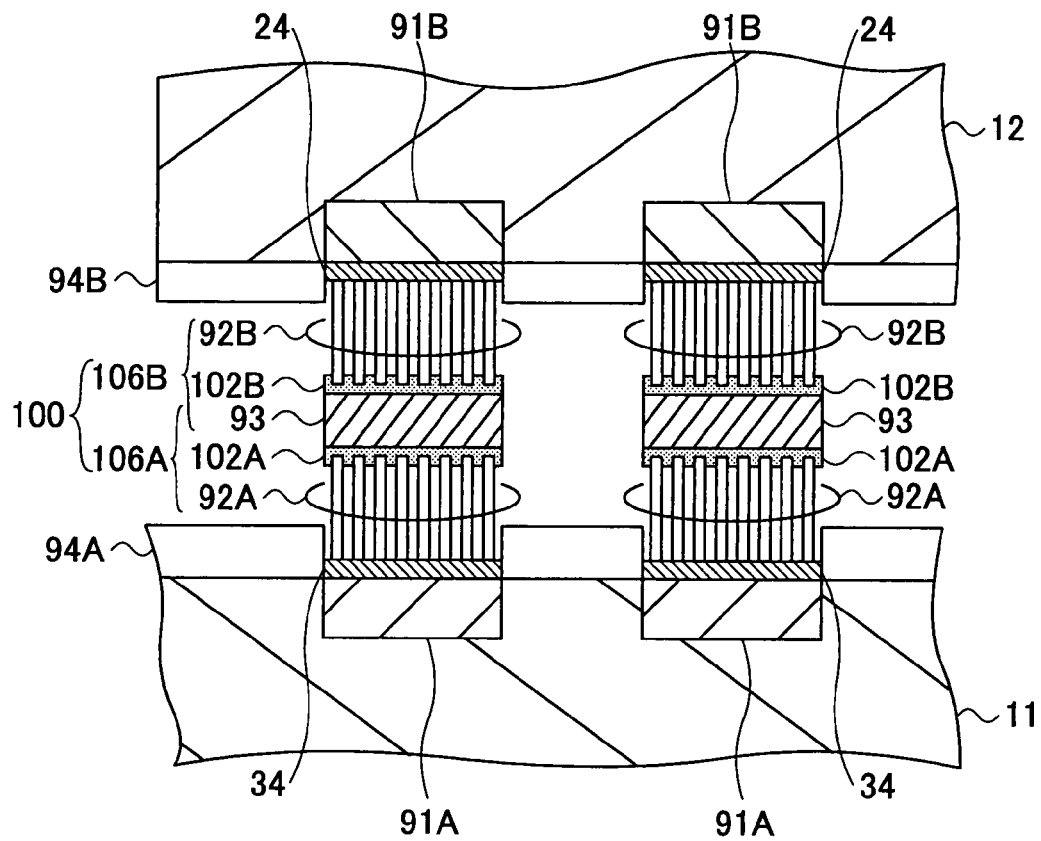
FIG. 15 is a cross-sectional view of a ninth example of the connection mechanism according to the first embodiment of the present invention.

FIG. 15 is a cross-sectional view of a connection mechanism 100, which is the ninth example of the connection mechanism. The connection mechanism 100 is a variation of the connection mechanism 90 (FIG. 14). In FIG. 15, parts corresponding to those described above are referred to by the same reference numerals, and a description thereof is omitted.

Referring to FIG. 15, the connection mechanism 100 includes device-side terminals each having the CNT bundle 92B provided on the semiconductor device 12 and a carbide-forming metal layer 102B provided at the end part of the CNT bundle 92B; board-side terminals each having the CNT bundle 92A provided on the circuit board 11 and a carbide-forming metal layer 102A provided at the end part of the CNT bundle 92A; and the low-melting metal layer 93 joining the carbide-forming metal layers 102A and 102B to each other.

The carbide-forming metal layers 102A and 102B are formed of, for example, Ti, Nb, Mo, Si, Ta, Zn, B, Zr, W, or Ca, and form carbide at the interfaces with the end parts of the CNTs of the CNT bundles 92A and 92B, respectively. For example, if the carbide-forming metal layers 102A and 102B are Ti, an extremely thin TiC film is formed at the interface with the end parts of the CNTs of each of the CNT bundles 92A and 92B. Formation of carbide between the CNTs and each of the carbide-forming metal layers 102A and 102B reduces the electrical resistance between the CNT bundles 92A and 92B and the carbide-forming metal layers 102A and 102B, and increases the mechanical strength of their connections.

The connection mechanism 100 establishes electrical connection between the semiconductor device 12 and the circuit board 11 and mechanically fixes the semiconductor device 12 and the circuit board 11 by joining the carbide-forming metal layers 102A and 102B with the low-melting metal layer 93. According to the connection mechanism 100, the CNT bundles 92A and 92B are joined with the low-melting metal layer 93. Accordingly, the CNT bundles 92A and 92B can be easily attached and detached by heating.

Next, a description is given, with reference to FIGS. 16A through 16F, of a method of manufacturing the connection mechanism 100. Since the method of manufacturing the above-described connection mechanism 90 is substantially the same as the method of manufacturing the connection mechanism 100, a description thereof is omitted.

FIGS. 16A through 16F are diagrams showing a manufacturing process of the connection mechanism 100. Here, a description is given, taking a method of forming the CNT bundle 92A on the circuit board 11. The method of forming the CNT bundle 92B on the semiconductor device 12 is substantially the same.

Figure 16A:
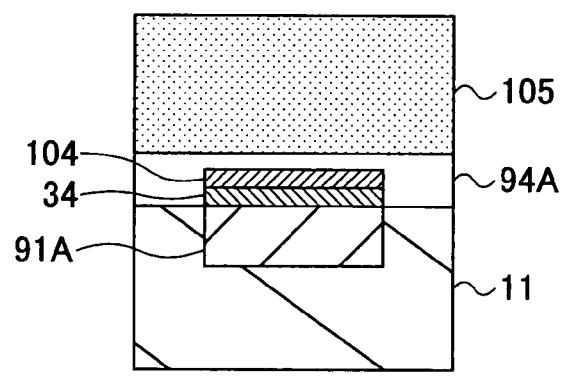
FIGS. 16A through 16F are diagrams showing a method of manufacturing the ninth example of the connection mechanism according to the first embodiment of the present invention.

First, in the process of FIG. 16A, the underlayer 34 of the above-described material, such as a Ti film (for example, 2 nm in thickness), is formed by vapor deposition or sputtering on the surface of the electrode 91A provided in the surface of the circuit board 11. Next, a catalyst layer 104 of the above-described material, such as a Ni film (for example, 30 nm in thickness), is formed on the underlayer 34 by vapor deposition or sputtering. A particulate catalyst layer may be formed by electroless plating instead of the catalyst layer 104.

In the process of FIG. 16A, a first insulating film 94A and a second insulating film 105 are formed on the surface of the circuit board 11 and the catalyst layer 104 by vacuum evaporation, sputtering, or CVD. The insulating materials of the first insulating film 94A and the second insulating film 105 are not limited in particular as long as they have etching selectivity with respect to each other. For example, a silicon nitride film (for example, 1000 nm in thickness) is employed for the first insulating film 94A, and a silicon oxide film (for example, 1000 nm in thickness) is employed for the second insulating film 105.

Figure 16B:
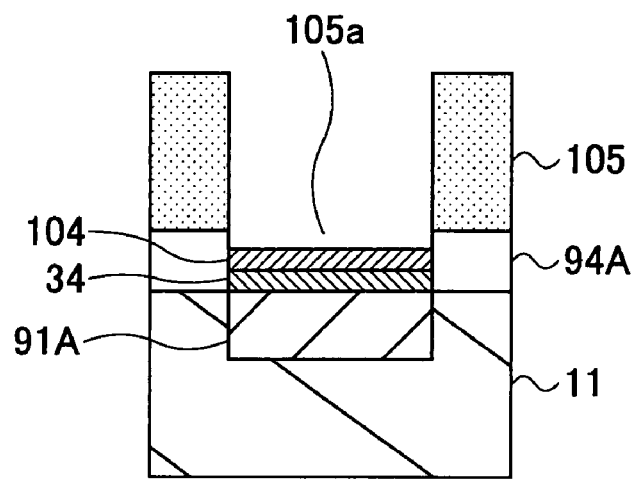

Next, in the process of FIG. 16B, a resist film (not graphically illustrated) is formed on the second insulating film 105, and the resist film is patterned by photolithography. Next, the second insulating film 105 and the first insulting film 94A are successively etched by RIE (Reactive Ion Etching) using the resist film as a mask, so that an opening part 105a that exposes the catalyst layer 104 is formed.

Figure 16C:
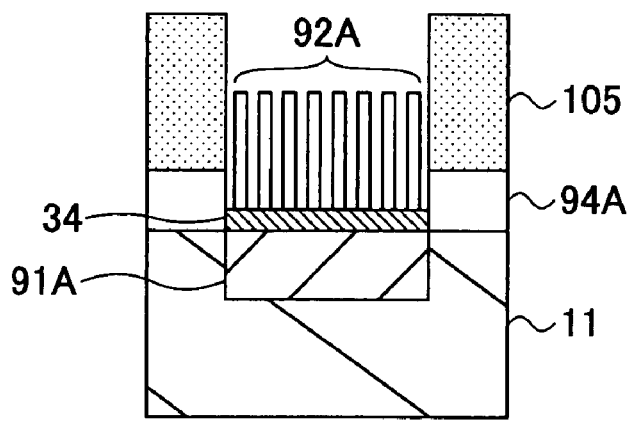

Next, in the process of FIG. 16C, the CNT bundle 92A is formed by thermal CVD or plasma CVD using the catalyst layer 104 as a catalyst. Specifically, the CNT bundle 92A is formed by, for example, thermal CVD, feeding a hydrocarbon gas such as acetylene or methane as a material gas and a hydrogen gas as a carrier gas with the heating temperature being set at 400° C. to 900° C., preferably 400° C. to 600° C., and the pressure being set at 1 kPa. By these settings, the catalyst layer 104 forms particulates, and CNTs grow using each particulate as a nucleus of growth. As a result, the CNT bundle 92A is formed. The CNT bundle 92A grows substantially linearly in a direction perpendicular to the surface of the underlayer 34, that is, the upward direction.

Here, the length of the CNT bundle 92A is determined so as to prevent the CNT bundle 92A from protruding from the surface of the second insulating film 105 even with the thickness of the carbide-forming metal layer 102A and the low-melting metal layer 93 formed on the CNT bundle 92A in the next process being added to its length.

Figure 16D:
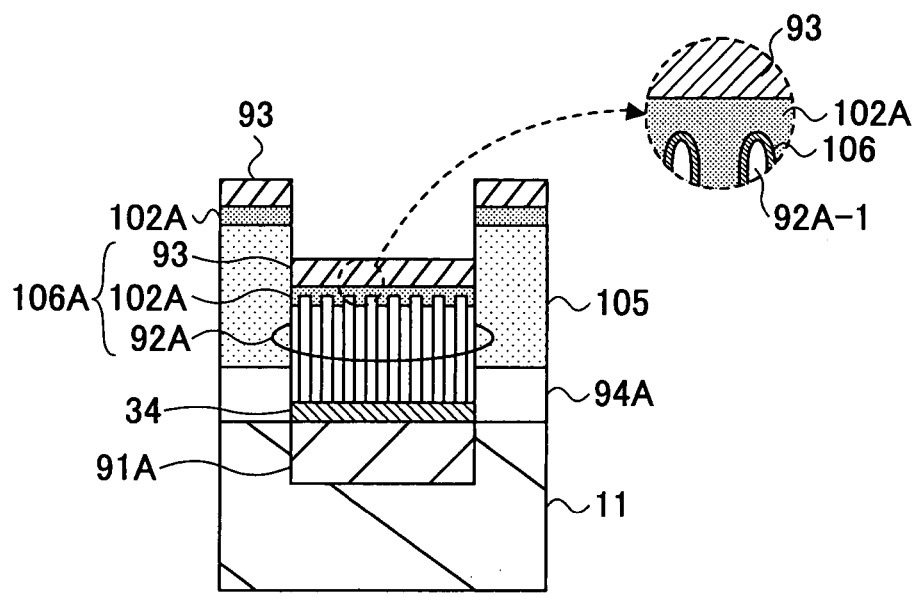

Next, in the process of FIG. 16D, the carbide-forming metal layer 102A such as a Ti film is formed on the surface of the CNT bundle 92A by vacuum evaporation or sputtering. Next, the carbide-forming metal layer 102A is heated at a temperature of 20° C. to 400° C. As a result of this heat treatment, an extremely thin carbide film 106 is formed at the end part of each CNT as shown enlarged in a broken circle in FIG. 16D. The carbide film 106 is a reaction product of the carbon of a CNT 92A-1 and the metal material of the carbide-forming metal layer 102A. The end part of a CNT has a closed structure as fullerene, but is formed of six-membered and five-membered rings of carbon. Accordingly, the end part of the CNT is less stable than a graphene sheet formed of only six-membered rings. Accordingly, the carbide film 106 is formed at the interface of the end part of the CNT 92A-1 and the carbide-forming metal layer 102A at temperatures lower than normal. Before the formation of the carbide-forming metal layer 102A, the end part of the CNT 92A-1 may be etched by RIE to be ring-opened. This facilitates formation of the carbide film 106, so that it is possible to further reduce the contact resistance of the CNT bundle 92A and the carbide-forming metal layer 102A.

The carbide film 106 may be formed by depositing a carbide material on the surface of the CNT bundle 92A. Specifically, a carbide film of a carbide material may be formed on the surface of the CNT bundle 92A by sputtering or pulse laser deposition before forming the carbide-forming metal film 102A in the process of FIG. 16D. In this case, formation of the carbide-forming metal film 102A may be omitted.

Further, in the process of FIG. 16D, the low-melting metal layer 93 of In or the like is formed on the carbide-forming metal layer 102A by vacuum evaporation or sputtering. Thus, a CNT bundle structure 106A including the CNT bundle 92A, the carbide-forming metal layer 102A, and the low-melting metal layer 93 is formed.

Figure 16E:
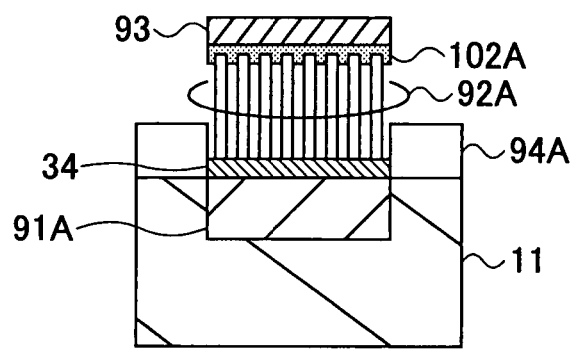

Next, in the process of FIG. 16E, the second insulating film 105 is removed by lift-off together with the low-melting metal layer 93 and the carbide-forming metal layer 102A on the second insulating film 105. Specifically, lift-off is performed using a fluorine-based gas or a hydrofluoric acid-based etchant if the second insulating film 105 is an oxide film. If the second insulating film 105 is a resist, lift-off is performed using an organic solvent such as acetone. As a result, the surface of the first insulating film 94A is exposed, so that a structure having the CNT bundle structure 106A projecting from the surface of the first insulating film 94A is formed.

Figure 16F:
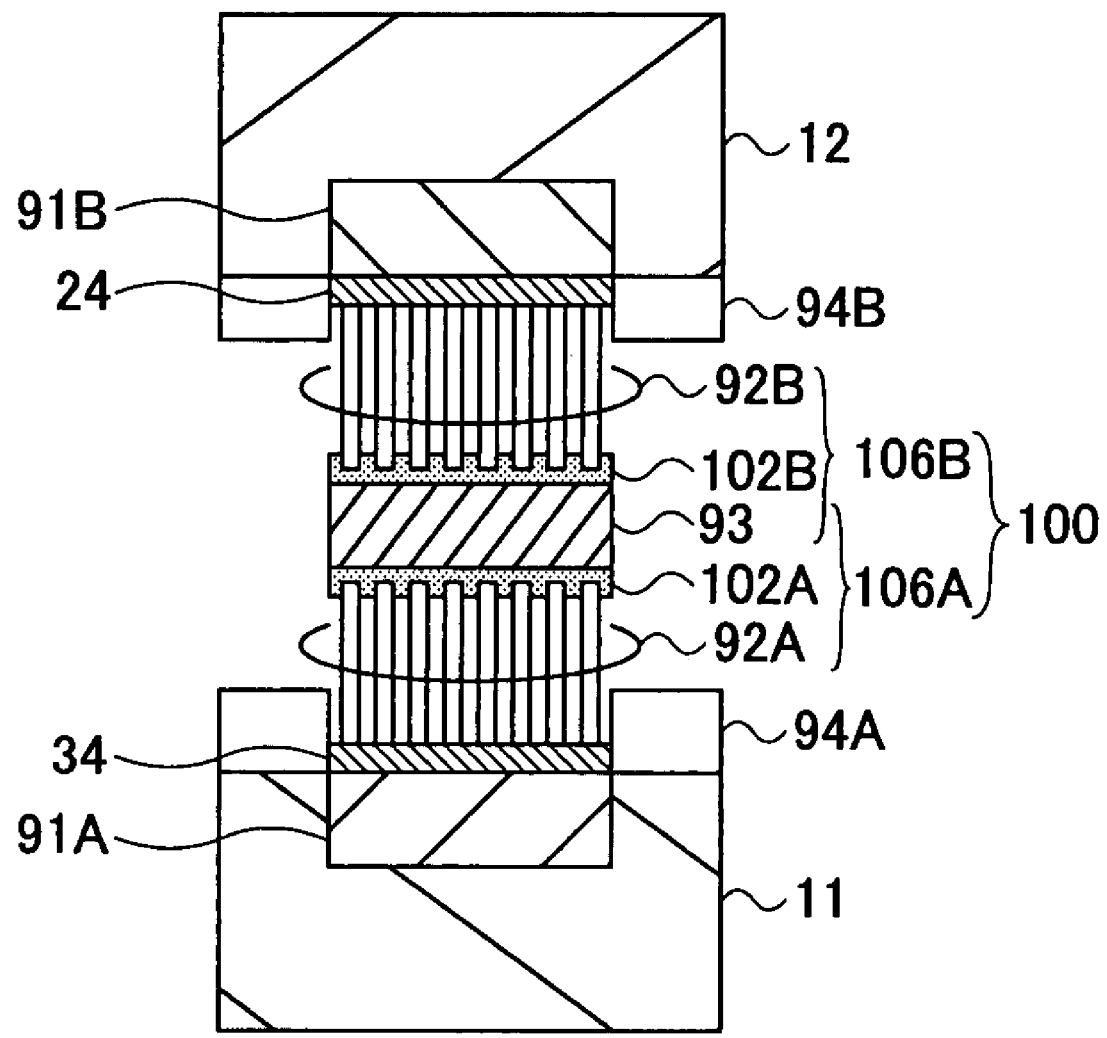

Next, in the process of FIG. 16F, a CNT bundle structure 106B, which is the same as the CNT bundle structure 106A, is formed on the semiconductor device 12 in the same manner as in the process of FIG. 16E.

Further, in the process of FIG. 16F, the CNT bundle structure 106A of the circuit board 11 and the CNT bundle structure 106B of the semiconductor device 12 are joined. Specifically, first, the semiconductor device 12 and the circuit board 11 are positioned in order to be connected. After the positioning, the CNT bundle structure 106A of the circuit board 11 and the CNT bundle structure 106B formed on the semiconductor device 12 are fixed by heat treatment at temperatures of 20° C. to 400° C. with their low-melting metal layers 93 being in contact with each other. The low-melting metal layer 93 of one of the CNT bundle structures 106A and 106B may be omitted. Thereby, the connection mechanism 100 is formed.

In the above-description of the first through ninth examples of the connection mechanism, the case where a device-side terminal is provided on a semiconductor substrate and a board-side (circuit-side) terminal is provided on a circuit board is taken as an example. However, the device-side terminal and the circuit-side terminal may be interchanged. That is, the circuit-side terminal may be provided on the semiconductor substrate and the device-side terminal may be provided on the circuit board.

Further, in the above description of the first through ninth examples of the connection mechanism, the case of connecting a semiconductor device and a circuit board is taken as an example. However, the above-described connection mechanisms may also be used to connect two semiconductor devices or two circuit boards. That is, for example, an electrical connection mechanism of a first circuit unit and a second circuit unit can be formed in the same manner, and the same effects are produced.

Second Embodiment

Figure 17:
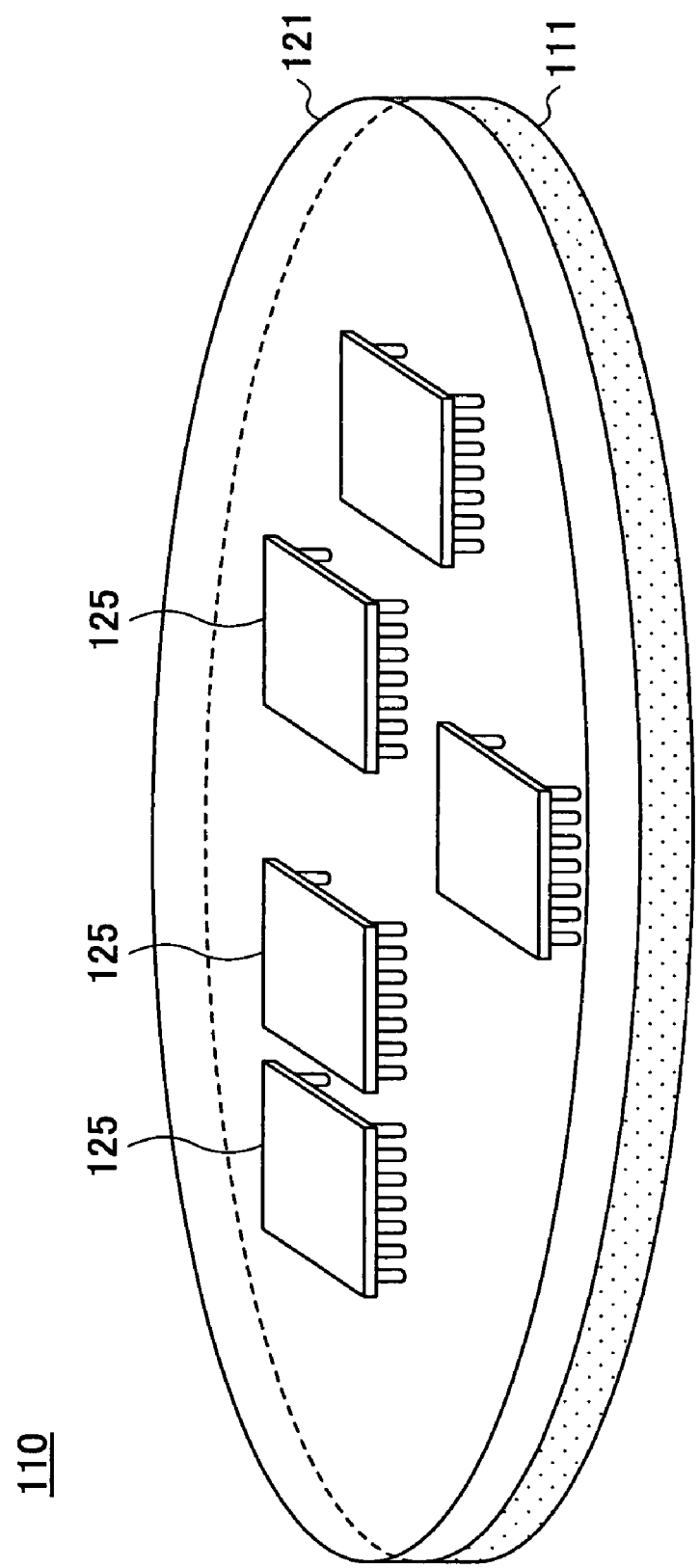
FIG. 17 is a schematic perspective view of a semiconductor package according to a second embodiment of the present invention.
Figure 18:
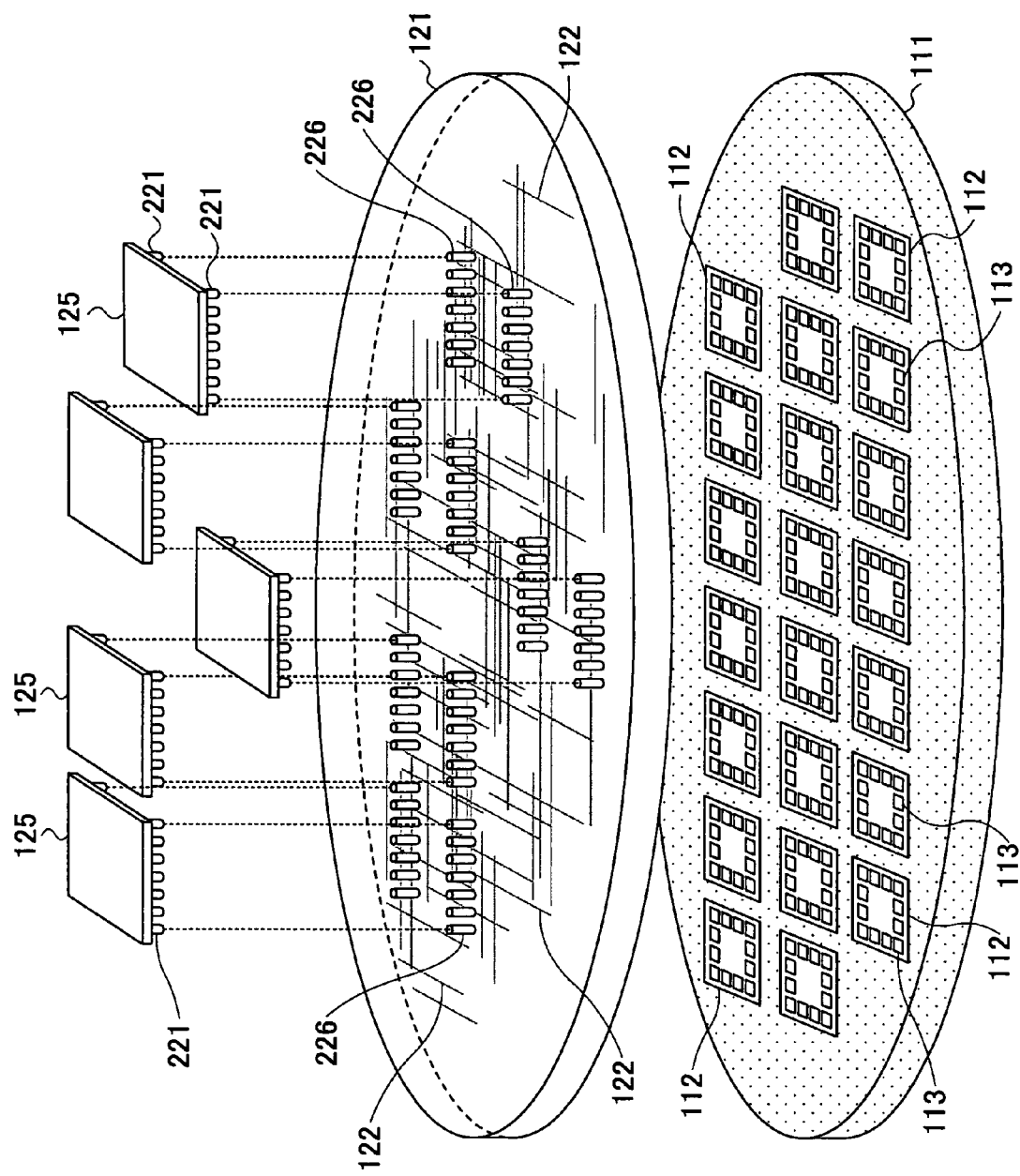
FIG. 18 is a schematic exploded perspective view of the semiconductor package of FIG. 17 according to the second embodiment of the present invention.

FIG. 17 is a schematic perspective view of a semiconductor package 110 according to a second embodiment of the present invention. FIG. 18 is a schematic exploded perspective view of the semiconductor package 110 of FIG. 17.

Referring to FIGS. 17 and 18, the semiconductor package 110 according to the second embodiment includes a chip substrate 111 on which semiconductor chips 112 are formed, a wiring (interconnection) board 121 provided on the chip substrate 111, and externally-provided semiconductor chips 125 detachably and re-attachably mounted on the wiring board 121.

The multiple semiconductor chips 112 each having various functions on a semiconductor substrate such as a silicon substrate are formed on the chip substrate 111. The semiconductor chips 112 include, for example, an MPU, memory circuits such as a DRAM and a ROM, and signal processing circuits. Chip substrate electrodes 113 for connection to the wiring board 121 are provided on the surface of each semiconductor chip 112.

The wiring board 121 has, for example, a multilayer interconnection structure. The wiring board 121 includes chip substrate-side electrodes (not graphically illustrated) formed on its surface on the chip substrate 111 side and electrically connected to the corresponding chip substrate electrodes 113; board-side terminals 226 on its surface on the external semiconductor chips 125 attachment side; and interconnection layers 122 connecting these semiconductor chips 125. The board-side terminals 226 may be any of the board-side terminals of the above-described first through ninth examples of the connection mechanism.

The external semiconductor chips 125 include various circuits the same as the semiconductor chips 112 of the chip substrate 111. Each of the external semiconductor chips 125 has device-side terminals 221 provided at the bottom or a side thereof. The device-side terminals 221 may be any of the device-side terminals of the above-described first through ninth examples of the connection mechanism, which device-side terminals correspond to the board-side terminals 226. According to this configuration, the external semiconductor chips 125 can be easily attached to and detached from the wiring board 121.

According to a method of manufacturing the semiconductor package 110 of this embodiment, the chip substrate 111 and the external semiconductor chips 125 are manufactured by a known method of manufacturing a semiconductor chip. The device-side terminals 221 of the external semiconductor chips 125 are formed by a corresponding one of the methods of manufacturing the first through ninth examples of the connection mechanism.

Further, the wiring board 121 is formed by, for example, providing an interlayer insulating layer, the interconnection layers 122, the chip substrate-side electrodes, and the board-side terminals 226 on a semiconductor substrate. The board-side terminals 226 are formed by a corresponding one of the methods of manufacturing the first through ninth examples of the connection mechanism. Next, the wiring board 121 and the chip substrate 111 are stuck together by a positioning method using infrared passing therethrough.

The wiring board 121 may be formed by forming a multilayer interconnection structure directly on the chip substrate 111 and providing the board-side terminals 226 thereon.

According to the semiconductor package 110 of this embodiment, for example, semiconductor chips that are better in yield and longer in product life than the external semiconductor chips 125 are assigned to the chip substrate 111 as the semiconductor chips 112. On the other hand, for example, semiconductor chips that are relatively lower in yield and relatively shorter in product life than the semiconductor chips 112 of the chip substrate 111 are assigned as the external semiconductor chips 125. This makes it possible to easily replace the external semiconductor chips 125 with normal products if the external semiconductor chips 125 are defective or in the case of their failure. Accordingly, it is possible to use the semiconductor package 110 for a long period of time without waste. As a result, it is possible to lower the cost of the semiconductor package 110. Further, providing more semiconductor chips on the chip substrate 111 than conventional semiconductor packages makes it possible to reduce the size of the semiconductor package 110.

According to one aspect of the present invention, there is provided a semiconductor package including a semiconductor device; a circuit board; and a connection mechanism including a first conductive terminal provided on the semiconductor device, and a second conductive terminal provided on the side of the circuit board, the connection mechanism electrically connecting the semiconductor device and the circuit board via the first conductive terminal and the second conductive terminal, wherein at least one of the first conductive terminal and the second conductive terminal of the connection mechanism includes one or more carbon nanotubes each having one end thereof fixed to the surface of the at least one of the first conductive terminal and the second conductive terminal, and extending in a direction away from the surface, and the first conductive terminal and the second conductive terminal engage each other through the carbon nanotubes.

According to the above-described semiconductor package, since carbon nanotubes have flexibility and elasticity, it is possible to repeatedly insert and extract the first conductive terminal or the second conductive terminal, so that the semiconductor device and the circuit board can be repeatedly attached to and detached from each other. As a result, it is possible to reduce the manufacturing cost of the semiconductor package by replacing only the semiconductor device or the circuit board if the semiconductor device or the circuit board is defective or fails. In particular, even if the semiconductor package contains a defective product (part or component), only the defective product may be replaced, and unlike in the conventional case, there is no need to discard good products (parts or components). Accordingly, it is possible to reduce consumption of resources. Further, since carbon nanotubes have extremely high mechanical strength, the connection mechanism can support the semiconductor device and firmly join the semiconductor device and the circuit board mechanically.

According to one aspect of the present invention, there is provided a semiconductor package including a semiconductor device; a circuit board; and a connection mechanism including a first conductive terminal provided on the semiconductor device, and a second conductive terminal provided on the side of the circuit board, the connection mechanism electrically connecting the semiconductor device and the circuit board via the first conductive terminal and the second conductive terminal, wherein the connection mechanism further includes a first bundle of carbon nanotubes having a first end thereof fixed to the surface of the first conductive terminal, and extending in a direction away from the surface; a second bundle of carbon nanotubes having a first end thereof fixed to the surface of the second conductive terminal, and extending in a direction away from the surface; and a low-melting metal layer fixing a second end part of the first bundle of the carbon nanotubes and a second end part of the second bundle of the carbon nanotubes to each other with the second end of the first bundle of the carbon nanotubes and the second end of the second bundle of the carbon nanotubes opposing each other across the low-melting metal layer.

According to one aspect of the present invention, there is provided a method of manufacturing a semiconductor package, the semiconductor package including a semiconductor device; a circuit board; and a connection mechanism including a first conductive terminal provided on the semiconductor device, and a second conductive terminal provided on the side of the circuit board, the connection mechanism electrically connecting the semiconductor device and the circuit board via the first conductive terminal and the second conductive terminal, the method including the steps of forming a catalyst layer on at least one of the first conductive terminal and the second conductive terminal, the catalyst layer covering the surface of the at least one of the first conductive terminal and the second conductive terminal; and forming a carbon nanotube using the catalyst layer as a starting point of growth of the carbon nanotube.

According to the above-described method, it is possible to cause carbon nanotubes to grow on the surfaces of the first conductive terminal and the second conductive terminal, and it is possible to realize a connection mechanism that allows attachment and detachment of the semiconductor device and the circuit board.

Additionally, in the above-described method, the catalyst layer may include at least one metal selected from the group consisting of Co, Ni, Fe, and Mo or an intermetallic compound containing the at least one metal, and the catalyst layer may be in a particulate state.

By causing the catalyst layer to be in a state of particulates of such a material, it is possible to form carbon nanotubes with good controllability of their density.

Additionally, in the above-described method, the step of forming the carbon nanotube may use one of thermal CVD and plasma CVD.

Even if the first conductive terminal or the second conductive terminal has a complicated surface shape, it is possible to form carbon nanotubes because thermal CVD and plasma CVD allows a material gas to circulate on and come into contact with the surface of the first conductive terminal or the second conductive terminal.

The present invention is not limited to the specifically disclosed embodiments, and variations and modifications may be made without departing from the scope of the present invention.

For example, in the connection mechanisms 50, 60, and 70 of the first embodiment shown in FIGS. 10 through 12, the CNTs of one of the device-side terminal and the board-side terminal may be omitted. In this case, the CNTs of the other one of the device-side terminal and the board-side terminal may come into contact with the surface of the conductive base body or the concave part of the one of the device-side terminal and the board-side terminal.

Further, the underlayer provided at the base part of the CNTs in the first and second embodiments may be omitted.

Thus, according to one embodiment of the present invention, it is possible to provide an electrical connection mechanism that allows repeated attachment and detachment, a semiconductor package including the connection mechanism, and a method of manufacturing the semiconductor package.

What is claimed is:

1. A semiconductor package, comprising:
a semiconductor device;
a circuit board; and
a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal,
wherein at least one of the first conductive terminal and the second conductive terminal of the connection mechanism includes one or more carbon nanotubes each having one end thereof fixed to a surface of the at least one of the first conductive terminal and the second conductive terminal through an underlayer formed of a material selected from the group consisting of Ti, Mo, V, Nb, and W, and extending in a direction away from the surface, and
the first conductive terminal and the second conductive terminal engage each other through the carbon nanotubes.

2. The semiconductor package as claimed in claim 1, wherein the carbon nanotubes of the first conductive terminal and the carbon nanotubes of the second conductive terminal are in contact with each other.

3. A semiconductor package, comprising:
a semiconductor device;
a circuit board; and
a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal,
wherein at least one of the first conductive terminal and the second conductive terminal of the connection mechanism includes one or more carbon nanotubes each having one end thereof fixed to a surface of the at least one of the first conductive terminal and the second conductive terminal, and extending in a direction away from the surface,
the first conductive terminal and the second conductive terminal engage each other through the carbon nanotubes, and
the carbon nanotubes of the one of the first conductive terminal and the second conductive terminal are in contact with a surface of another one of the first conductive terminal and the second conductive terminal.

4. A semiconductor package, comprising:
a semiconductor device;
a circuit board; and
a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal,
wherein at least one of the first conductive terminal and the second conductive terminal of the connection mechanism includes one or more carbon nanotubes each having one end thereof fixed to a surface of the at least one of the first conductive terminal and the second conductive terminal, and extending in a direction away from the surface,
the first conductive terminal and the second conductive terminal engage each other through the carbon nanotubes,
the one of the first conductive terminal and the second conductive terminal includes a first one of a convex base body and a concave base body, and the carbon nanotubes each having the one end thereof fixed to a surface of the first one of the convex base body and the concave base body, and extending in a direction away from the surface,
another one of the first conductive terminal and the second conductive terminal includes a second one of the convex base body and the concave base body, and
the convex base body and the concave base body are fitted to each other with the carbon nanotubes being in contact with a surface of the second one of the convex base body and the concave base body or with the carbon nanotubes extending from the surface of the first one of the convex base body and the concave base body being in contact with the carbon nanotubes extending from the surface of the second one of the convex base body and the concave base body.

5. The semiconductor package as claimed in claim 4, wherein each of the carbon nanotubes of the one of the first conductive terminal and the second conductive terminal has the one end thereof fixed to the surface of the convex base body, and extends in a direction substantially perpendicular to the surface of the convex base body.

6. The semiconductor package as claimed in claim 4, wherein the convex base body includes a substantially columnar body part and a hemispheric end part.

7. The semiconductor package as claimed in claim 4, wherein the concave base body has one end of each of the carbon nanotubes fixed to a sidewall face of an opening part thereof, the carbon nanotubes extending in a direction substantially perpendicular to the sidewall face.

8. The semiconductor package as claimed in claim 4, wherein the concave base body has one end of each of the carbon nanotubes fixed to a bottom face of an opening part thereof, the carbon nanotubes extending in a direction substantially perpendicular to the bottom face.

9. A semiconductor package, comprising:
a semiconductor device;

a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, wherein at least one of the first conductive terminal and the second conductive terminal of the connection mechanism includes one or more carbon nanotubes each having one end thereof fixed to a surface of the at least one of the first conductive terminal and the second conductive terminal, and extending in a direction away from the surface, the first conductive terminal and the second conductive terminal engage each other through the carbon nanotubes, and the first conductive terminal and the second conductive terminal have the respective carbon nanotubes extending in directions in which the first conductive terminal and the second conductive terminal engage each other, and the carbon nanotubes are in contact with each other along longitudinal directions thereof.

10. A semiconductor package, comprising:

a semiconductor device;

a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, wherein at least one of the first conductive terminal and the second conductive terminal of the connection mechanism includes one or more carbon nanotubes each having one end thereof fixed to a surface of the at least one of the first conductive terminal and the second conductive terminal, and extending in a direction away from the surface, the first conductive terminal and the second conductive terminal engage each other through the carbon nanotubes, the first conductive terminal comprises a base body including a flat surface; and the carbon nanotubes each having the one end thereof fixed to the flat surface, and extending in a direction substantially perpendicular to the flat surface, the second conductive terminal comprises a concave base body; and the carbon nanotubes each having the one end thereof fixed to a bottom face of an opening part of the concave base body, and extending in a direction substantially perpendicular to the bottom face, and the first conductive terminal and the second conductive terminal have the respective carbon nanotubes in contact with each other along longitudinal directions thereof.

11. A semiconductor package, comprising:

a semiconductor device;

a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, wherein at least one of the first conductive terminal and the second conductive terminal of the connection mechanism includes one or more carbon nanotubes each having one end thereof fixed to a surface of the at least one of the first conductive terminal and the second conductive terminal, and extending in a direction away from the surface, the first conductive terminal and the second conductive terminal engage each other through the carbon nanotubes, the first conductive terminal comprises a base body including a flat surface; and the carbon nanotubes each having the one end thereof fixed to the flat surface, and extending in a direction substantially perpendicular to the flat surface, the second conductive terminal comprises a concave base body; and the carbon nanotubes each having the one end thereof fixed to a sidewall face of an opening part of the concave base body, and extending in a direction substantially perpendicular to the sidewall face, and the first conductive terminal and the second conductive terminal have the respective carbon nanotubes crossing each other to be in mutual contact.

12. A semiconductor package, comprising:

a semiconductor device;

a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, wherein at least one of the first conductive terminal and the second conductive terminal of the connection mechanism includes one or more carbon nanotubes each having one end thereof fixed to a surface of the at least one of the first conductive terminal and the second conductive terminal, and extending in a direction away from the surface, the first conductive terminal and the second conductive terminal engage each other through the carbon nanotubes, the first conductive terminal comprises a base body including a tapered end part; and the carbon nanotubes each having the one end thereof fixed to a surface of the tapered end part, and extending in a direction in which the first conductive terminal engages the second conductive terminal, the second conductive terminal comprises a concave base body; and the carbon nanotubes each having the one end thereof fixed to a sidewall face of an opening part of the concave base body, and extending in a direction substantially perpendicular to the sidewall face until the carbon nanotubes are bent to extend upward due to an interaction therebetween, and the first conductive terminal and the second conductive terminal have the respective carbon nanotubes in contact with each other along longitudinal directions thereof.

13. A semiconductor package, comprising:

a semiconductor device;

a circuit board; and a connection mechanism including a first conductive terminal provided on the semiconductor device, and a second conductive terminal provided on a side of the circuit board, the connection mechanism electrically connecting the semiconductor device and the circuit board via the first conductive terminal and the second conductive terminal, wherein the connection mechanism further comprises a first bundle of carbon nanotubes having a first end thereof fixed to a surface of the first conductive terminal, and extending in a direction away from the surface;

a second bundle of carbon nanotubes having a first end thereof fixed to a surface of the second conductive terminal, and extending in a direction away from the surface; and a low-melting metal layer fixing a second end part of the first bundle of the carbon nanotubes and a second end part of the second bundle of the carbon nanotubes to each other with the second end of the first bundle of the carbon nanotubes and the second end of the second bundle of the carbon nanotubes opposing each other across the low-melting metal layer.

14. The semiconductor package as claimed in claim 13, wherein:

the connection mechanism further comprises a first carbide-forming layer covering the second end part of the first bundle of the carbon nanotubes and a second carbide-forming layer covering the second end part of the second bundle of the carbon nanotubes, and the low-melting metal layer fixes the second end part of the first bundle of the carbon nanotubes and the second end part of the second bundle of the carbon nanotubes to each other through the first carbide-forming layer and the second carbide-forming layer with the second end of the first bundle of the carbon nanotubes and the second end of the second bundle of the carbon nanotubes opposing each other across the low-melting metal layer.

15. The semiconductor package as claimed in claim 14, wherein the first carbide-forming layer and the second carbide-forming layer comprise one selected from the group consisting of Ti, Nb, Mo, Si, Ta, Zn, B, Zr, W, and Ca.

16. The semiconductor package as claimed in claim 13, wherein the low-melting metal layer comprises at least on selected from the group consisting of In, Al, Ga, Ag, Hg, Zn, Cd, Sn, and Tl.

17. A semiconductor package, comprising:

a chip substrate having a first semiconductor chip formed thereon;

a wiring board provided on the chip substrate; and a second semiconductor chip mounted on the wiring board, wherein the wiring board includes an interconnection layer electrically connected to the first semiconductor chip and the second semiconductor chip, and the interconnection layer and the second semiconductor chip are electrically connected with the connection mechanism as set forth in claim 1.

* * * * *